(12) United States Patent
Kamada et al.

(10) Patent No.: US 10,988,647 B2
(45) Date of Patent: Apr. 27, 2021

(54) SEMICONDUCTOR SUBSTRATE MANUFACTURING METHOD, SEMICONDUCTOR DEVICE, AND METHOD FOR MANUFACTURING SAME

(71) Applicant: Mitsui Chemicals, Inc., Tokyo (JP)

(72) Inventors: Jun Kamada, Narashino (JP); Kaichiro Haruta, Ichihara (JP); Takashi Unezaki, Ichihara (JP); Kiyomi Imagawa, Chiba (JP); Kenichi Fujii, Yokohama (JP); Yasuhisa Kayaba, Urayasu (JP); Kazuo Kohmura, Chiba (JP)

(73) Assignee: MITSUI CHEMICALS, INC., Tokyo (JP)

( * ) Notice: Subject to any disclaimer, the term of this patent is extended or adjusted under 35 U.S.C. 154(b) by 0 days.

(21) Appl. No.: 16/606,789

(22) PCT Filed: Apr. 19, 2018

(86) PCT No.: PCT/JP2018/016187
§ 371 (c)(1),
(2) Date: Oct. 21, 2019

(87) PCT Pub. No.: WO2018/194133
PCT Pub. Date: Oct. 25, 2018

(65) Prior Publication Data
US 2020/0377772 A1 Dec. 3, 2020

(30) Foreign Application Priority Data
Apr. 21, 2017 (JP) .............................. JP2017-084694

(51) Int. Cl.
*C09J 179/08* (2006.01)
*C09J 5/00* (2006.01)
(Continued)

(52) U.S. Cl.
CPC .............. *C09J 179/08* (2013.01); *C09J 5/00* (2013.01); *H01L 21/304* (2013.01); *H01L 21/56* (2013.01)

(58) Field of Classification Search
CPC . C09J 179/08; C09J 5/00; H01L 21/56; H01L 21/304
(Continued)

(56) References Cited

U.S. PATENT DOCUMENTS 8,643,165 B2 * 2/2014 Edwards ................. H01L 21/56
257/690
2013/0171749 A1 7/2013 Guu et al.
(Continued)

FOREIGN PATENT DOCUMENTS

JP 2005116610 A 4/2005
JP 2011-132354 A 7/2011
(Continued)

OTHER PUBLICATIONS

International Search Report (PCT/ISA/210) dated Jul. 3, 2018, by the Japanese Patent Office as the International Searching Authority for International Application No. PCT/JP2018/016187.
(Continued)

*Primary Examiner* — Vu A Vu
(74) *Attorney, Agent, or Firm* — Buchanan Ingersoll & Rooney PC

(57) ABSTRACT

The purpose of the present invention is to provide a semiconductor substrate manufacturing method, which prevents detachment of a semiconductor wafer being ground, and which prevents cracking or chipping in a semiconductor substrate obtained. In order to solve the problem, the semiconductor substrate manufacturing method comprises: a polyimide layer forming step of forming a polyimide layer on a support material; a wafer attaching step of affixing the support material and a semiconductor wafer to each other with the polyimide layer disposed therebetween; a wafer grinding step of grinding the semiconductor wafer; a support material peeling step of peeling the support material from
(Continued)

the polyimide layer; and a polyimide layer peeling step of peeling the polyimide layer from the semiconductor wafer. The polyimide layer includes polyimide which includes a benzophenone skeleton and an aliphatic structure, wherein an amine equivalent weight is 4000 to 20000.

18 Claims, 3 Drawing Sheets

(51) Int. Cl.
*H01L 21/304* (2006.01)
*H01L 21/56* (2006.01)

(58) Field of Classification Search
USPC .......................................................... 438/118
See application file for complete search history.

(56) References Cited

U.S. PATENT DOCUMENTS

2013/0288120 A1  10/2013  Iida et al.
2015/0179494 A1*  6/2015  Kawamori ............ H01L 21/304
                                                                    438/464
2016/0133486 A1*  5/2016  Andry .................. B32B 43/006
                                                                    428/40.4

FOREIGN PATENT DOCUMENTS

| | | |
|---|---|---|
| JP | 2013140971 A | 7/2013 |
| JP | 2016056060 A | 4/2016 |
| JP | 2016219511 A | 12/2016 |
| WO | 2013008437 A1 | 1/2013 |
| WO | 2013183293 A1 | 12/2013 |
| WO | 2014003056 A1 | 1/2014 |
| WO | 2014196296 A1 | 12/2014 |
| WO | 2015033867 A1 | 3/2015 |
| WO | 2015053132 A1 | 4/2015 |

OTHER PUBLICATIONS

Written Opinion (PCT/ISA/237) dated Jul. 3, 2018, by the Japanese Patent Office as the International Searching Authority for International Application No. PCT/JP2018/016187.

* cited by examiner

SEMICONDUCTOR SUBSTRATE MANUFACTURING METHOD, SEMICONDUCTOR DEVICE, AND METHOD FOR MANUFACTURING SAME

TECHNICAL FIELD

The present invention relates to a method for manufacturing a semiconductor substrate, a semiconductor apparatus, and a method for manufacturing the same.

BACKGROUND ART

In recent years, electronic equipment has been required to be reduced in size, reduced in thickness, reduced in weight, and increased in integration, and semiconductor wafers have been required to be reduced in thickness. A known method for a reduction in thickness of a semiconductor wafer is a method of grinding a face of a semiconductor wafer, on which no circuit is formed (herein, also referred to as "non-circuit-formed face"). The method includes preparing a member where adhesion layer 2 is formed on support material 1, for example, as illustrated in FIG. 1 (FIG. 1A), then bonding support material 1 and face 3a of semiconductor wafer 3, on which a circuit is formed (herein, also referred to as "circuit-formed face"), to each other with adhesion layer 2 being interposed therebetween (FIG. 1B), then grinding non-circuit-formed face 3b with semiconductor wafer 3 being supported by support material 1 (FIG. 1C), and thereafter releasing support material 1 from semiconductor wafer (herein, also referred to as "semiconductor substrate") 3' after completion of the grinding (FIG. 1D) and furthermore releasing adhesion layer 2 from semiconductor substrate 3' (FIG. 1E).

A through-silicon via (TSV) technique which includes stacking thin semiconductors with a penetration electrode has also been put in practical use, as a procedure for an increase in integration, and there has been an increased need for handling such wafers stacked, in a manufacturing process, year by year.

On the other hand, a procedure for a reduction in size of a semiconductor apparatus, which has been recently adopted, is a fan out wafer level package (hereinafter, also referred to as "FOWLP") or a fan out panel level package (hereinafter, also referred to as "FOPLP") which includes a semiconductor chip sealed with a sealing material, a rewiring layer formed outside the chip, and an external connection electrode connected to the rewiring layer. Various methods are studied as methods for producing the FOWLP or FOPLP, and known one thereof is, for example, a method including forming a rewiring layer on a support material and mounting a semiconductor chip on the rewiring layer (for example, PTL 1). The method includes preparing a member where adhesion layer 12 is formed on support material 11, for example, illustrated in FIG. 2 (FIG. 2A), forming rewiring layer 13 on support material 11 via adhesion layer 12 being interposed therebetween (FIG. 2B), thereafter mounting semiconductor chip 14 on rewiring layer 13 (FIG. 2C), sealing a region of semiconductor chip 14, other than a connection section to rewiring layer 13, with sealing material 15 (FIG. 2D), then releasing support material 11 (FIG. 2E), releasing, if necessary, adhesion layer 12, and thereafter forming external connection electrode 16 on rewiring layer 13 (FIG. 2F).

CITATION LIST

Patent Literature

PTL 1
Japanese Patent Application Laid-Open No. 2013-140971

SUMMARY OF INVENTION

Technical Problem

Polyimide is frequently used in an adhesion layer for use in the above method for manufacturing a semiconductor substrate and the above method for manufacturing a semiconductor apparatus, because polyimide is excellent in heat resistance. Polyimide, however, is often low in solubility in solvents, and has difficulty in forming a layer according to a coating method.

The following is then generally performed: a support material is coated with varnish of polyamide acid as a precursor of polyimide and such polyamide acid is imidized (ring-closing polymerization) on the support material. Such polyamide acid, however, is dehydrated and condensed in the imidization. Thus, a problem is that air bubbles (voids) are easily generated in the resulting adhesion layer (polyimide layer). The adhesion layer, when includes such air bubbles, is easily deteriorated in adhesiveness to other members because the surface thereof is hardly smoothened and furthermore the adhesion area is decreased.

On the other hand, conventional polyimide has been often high in glass transition temperature (Tg), and a problem has been that the temperature in bonding of a support material and a semiconductor wafer is required to be raised to, for example, 250° C. or more.

The present invention has been made in view of the above problems. That is, the present invention provides a method for manufacturing a semiconductor substrate, which does not cause dropping or the like of any semiconductor wafer in grinding and furthermore does not cause breaking, cracking, or the like on the resulting semiconductor substrate. The present invention also provides a semiconductor apparatus where neither cracks nor wiring disconnection and the like are present in a rewiring layer, and a method for manufacturing the semiconductor apparatus.

Solution to Problem

A first aspect of the present invention is the following method for manufacturing a semiconductor substrate.
[1] A method for manufacturing a semiconductor substrate, comprising: forming a polyimide layer on a support material; bonding the support material and a circuit-formed face of a semiconductor wafer with the polyimide layer being interposed therebetween; grinding a non-circuit-formed face of the semiconductor wafer to which the support material is bonded; releasing the support material from the polyimide layer; and releasing the polyimide layer from the semiconductor wafer, wherein polyimide for use in the polyimide layer has a glass transition temperature of 210° C. or less and is dissolvable in a solvent.
[2] The method for manufacturing a semiconductor substrate according to [1], wherein the polyimide comprises a polycondensation unit of a tetracarboxylic dianhydride (α) and a diamine (β), the tetracarboxylic dianhydride (α) comprises an aromatic tetracarboxylic dianhydride (α1) having a benzophenone backbone, represented by the following formula (1), or the diamine (β) comprises an aromatic diamine (β1) having a benzophenone backbone, represented by the following formula (2),

[Formula 1]

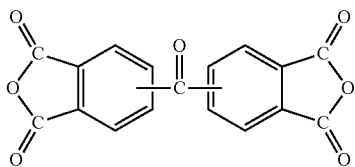
(1)

[Formula 2]

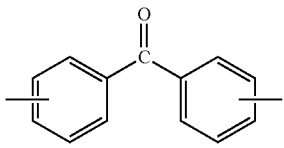
(2)

a total amount of the aromatic tetracarboxylic dianhydride (α1) and the aromatic diamine (β1) is 5 to 49 mol % based on a total amount of the tetracarboxylic dianhydride (α) and the diamine (β).
[3] The method for manufacturing a semiconductor substrate according to [2], wherein the diamine (β) comprises an aliphatic diamine (β5) represented by the following formula (3) or (4),

[Formula 3]

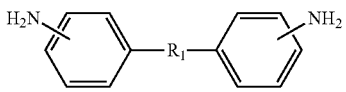
(3)

wherein in formula (3), $R_1$ is an aliphatic chain having a main chain containing any one or more atoms of C, N, and O, a total number of atoms constituting the main chain is 7 to 500, the aliphatic chain optionally further has a side chain containing any one or more atoms of C, N, H, and O, and a total number of atoms constituting the side chain is 10 or less,

[Formula 4]

$H_2N$—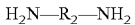—$NH_2$ (4)

wherein in formula (4), $R_2$ is an aliphatic chain having a main chain containing any one or more atoms of C, N, and O, a total number of atoms constituting the main chain is 5 to 500, the aliphatic chain optionally further has a side chain containing any one or more atoms of C, N, H, and O, and a total number of atoms constituting the side chain is 10 or less, and the polyimide has an amine equivalent of 4,000 to 20,000.
[4] The method for manufacturing a semiconductor substrate according to [3], wherein the total amount of the aromatic tetracarboxylic dianhydride (α1) and the aromatic diamine (β1) is 5 to 30 mol % based on the total amount of the tetracarboxylic dianhydride (α) and the diamine (β), a total amount of a tetracarboxylic dianhydride and a diamine each not having any aliphatic chain having 3 or more carbon atoms in a main chain is 95 mol % or more based on the total amount of the tetracarboxylic dianhydride (α) and the diamine (β), the tetracarboxylic dianhydride (α) comprises an aromatic tetracarboxylic dianhydride (α2) not having a biphenyl backbone but having a diphenyl ether backbone, or the diamine (β) comprises an aromatic diamine (β2) not having a biphenyl backbone but having a diphenyl ether backbone, a total amount of the aromatic tetracarboxylic dianhydride (α2) and the aromatic diamine (β2) is 40 mol % or more and 95 mol % or less based on the total amount of the tetracarboxylic dianhydride (α) and the diamine (β), and a total amount of an aromatic tetracarboxylic dianhydride (α) not having a biphenyl backbone but having a diphenyl ether backbone and having three or more aromatic rings, and an aromatic diamine (β3) not having a biphenyl backbone but having a diphenyl ether backbone and having three or more aromatic rings is 20 mol % or more based on the total amount of the tetracarboxylic dianhydride (α) and the diamine (β), the tetracarboxylic dianhydride (α) comprises an aromatic tetracarboxylic dianhydride (α4) having a biphenyl backbone, or the diamine (β) comprises an aromatic diamine (β4) having a biphenyl backbone, a total amount of the aromatic tetracarboxylic dianhydride (α4) and the aromatic diamine (β4) is 0 mol % or more and less than 45 mol % based on the total amount of the tetracarboxylic dianhydride (α) and the diamine (β), and the polyimide has a viscosity average molecular weight η of 0.6 or more and 1.60 or less.
[5] The method for manufacturing a semiconductor substrate according to anyone of [1] to [4], further comprising processing a non-circuit-formed face of the semiconductor wafer at a temperature of 180° C. or more, after the wafer grinding and before the support material releasing.
The method for manufacturing a semiconductor substrate according to any one of [1] to [5], further comprising forming an unevenness absorbing layer on the polyimide layer after the polyimide layer formation and before the wafer bonding, wherein the wafer bonding comprises bonding the support material and the circuit-formed face of the semiconductor wafer with the polyimide layer and the unevenness absorbing layer being interposed therebetween, and the polyimide layer releasing comprises releasing the unevenness absorbing layer and the polyimide layer from the semiconductor wafer.
[7] The method for manufacturing a semiconductor substrate according to anyone of [1] to [6], wherein the support material releasing comprises irradiating an interface between the support material and the polyimide layer with laser light.
The method for manufacturing a semiconductor substrate according to any one of [1] to [6], wherein
the support material releasing comprises dissolving at least a part of the polyimide layer with a solvent.
[9] The method for manufacturing a semiconductor substrate according to any one of [1] to [8], wherein
the polyimide layer formation comprises coating with a varnish comprising a solvent and the polyimide, and drying the varnish.
[10] The method for manufacturing a semiconductor substrate according to any one of [1] to [8], wherein the polyimide layer formation comprises bonding a polyimide sheet comprising the polyimide, to the support material.
A second aspect of the present invention is the following semiconductor apparatus and method for manufacturing the semiconductor substrate.
[11] A method for manufacturing a semiconductor apparatus, comprising: forming a polyimide layer on a support material, forming a rewiring layer on the support material with the polyimide layer being interposed therebetween;

disposing a semiconductor chip on the rewiring layer, and joining the rewiring layer and the semiconductor chip so as to electrically conduct the rewiring layer and the semiconductor chip; sealing the semiconductor chip joined to the rewiring layer, with a sealing material; and releasing the support material from the polyimide layer, wherein a polyimide for use in the polyimide layer has a glass transition temperature of 210° C. or less and is dissolvable in a solvent.

[12] The method for manufacturing a semiconductor apparatus according to [11], wherein the polyimide comprises a polycondensation unit of a tetracarboxylic dianhydride (α) and a diamine (β), the tetracarboxylic dianhydride (α) comprises an aromatic tetracarboxylic dianhydride (α1) having a benzophenone backbone, represented by the following formula (1), or the diamine (β) comprises an aromatic diamine (β1) having a benzophenone backbone, represented by the following formula (2),

[Formula 5]

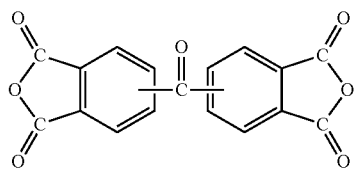
(1)

[Formula 6]

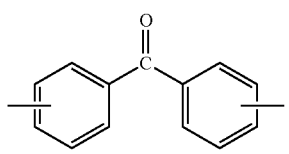
(2)

a total amount of the aromatic tetracarboxylic dianhydride (α1) and the aromatic diamine (β1) is 5 to 49 mol % based on a total amount of the tetracarboxylic dianhydride (α) and the diamine (β), the diamine (β) comprises an aliphatic diamine (β5) represented by the following formula (3) or (4),

[Formula 7]

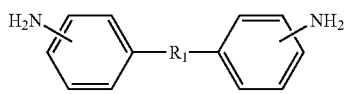
(3)

wherein in formula (3), $R_1$ is an aliphatic chain having a main chain containing any one or more atoms of C, N, and O, a total number of atoms constituting the main chain is 7 to 500, the aliphatic chain optionally further has a side chain containing any one or more atoms of C, N, H, and O, and a total number of atoms constituting the side chain is 10 or less,

[Formula 8]

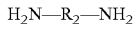
$H_2N-R_2-NH_2$ (4)

wherein in formula (4), $R_2$ is an aliphatic chain having a main chain containing any one or more atoms of C, N, and O, a total number of atoms constituting the main chain is 5 to 500, the aliphatic chain optionally further has a side chain containing any one or more atoms of C, N, H, and O, and a total number of atoms constituting the side chain is 10 or less, and the polyimide has an amine equivalent of 4,000 to 20,000.

[13] The method for manufacturing a semiconductor apparatus according to [12], wherein the total amount of the aromatic tetracarboxylic dianhydride (α1) and the aromatic diamine (β1) is 5 to 30 mol % based on the total amount of the tetracarboxylic dianhydride (α) and the diamine (β), a total amount of a tetracarboxylic dianhydride and a diamine each not having any aliphatic chain having 3 or more carbon atoms in a main chain is 95 mol % or more based on the total amount of the tetracarboxylic dianhydride (α) and the diamine (β), the tetracarboxylic dianhydride (α) comprises an aromatic tetracarboxylic dianhydride (α2) not having a biphenyl backbone but having a diphenyl ether backbone, or the diamine (β) comprises an aromatic diamine (β2) not having a biphenyl backbone but having a diphenyl ether backbone, a total amount of the aromatic tetracarboxylic dianhydride (α2) and the aromatic diamine (β2) is 40 mol % or more and 95 mol % or less based on the total amount of the tetracarboxylic dianhydride (α) and the diamine (β), and a total amount of an aromatic tetracarboxylic dianhydride (α3) not having a biphenyl backbone but having a diphenyl ether backbone and having three or more aromatic rings, and an aromatic diamine (β3) not having a biphenyl backbone but having a diphenyl ether backbone and having three or more aromatic rings is 20 mol % or more based on the total amount of the tetracarboxylic dianhydride (α) and the diamine (β), the tetracarboxylic dianhydride (α) comprises an aromatic tetracarboxylic dianhydride (α4) having a biphenyl backbone, or the diamine (β) comprises an aromatic diamine (β4) having a biphenyl backbone, a total amount of the aromatic tetracarboxylic dianhydride (α4) and the aromatic diamine (β4) is 0 mol % or more and less than 45 mol % based on the total amount of the tetracarboxylic dianhydride (α) and the diamine (β), and the polyimide has a viscosity average molecular weight η of 0.6 or more and 1.60 or less.

[14] The method for manufacturing a semiconductor apparatus according to any one of [11] to [13], wherein the method further comprises forming a release layer on the polyimide layer after the polyimide layer formation and before the rewiring layer formation, the rewiring layer formation comprises forming the rewiring layer on the support material with the polyimide layer and the release layer being interposed, and the method further comprises releasing the release layer from the rewiring layer after the support material releasing.

[15] The method for manufacturing a semiconductor apparatus according to any one of [11] to [14], further comprising forming, on the rewiring layer, an external connection electrode to be electrically connected to the rewiring layer, after the support material releasing.

[16] The method for manufacturing a semiconductor apparatus according to any one of [11] to [15], wherein the support material releasing comprises irradiating an interface between the support material and the polyimide layer with laser light.

[17] The method for manufacturing a semiconductor apparatus according to any one of [11] to [15], wherein the support material releasing comprises dissolving at least a part of the polyimide layer with a solvent.

[18] The method for manufacturing a semiconductor apparatus according to any one of [11] to [17], wherein polyimide layer formation comprises coating with a varnish comprising a solvent and the polyimide, and drying the varnish.

[19] The method for manufacturing a semiconductor apparatus according to any one of [11] to [17], wherein the polyimide layer formation comprises bonding a polyimide sheet comprising the polyimide, to the support material.

[20] A semiconductor apparatus, comprising: a semiconductor chip; an electrode formed on the semiconductor chip; a sealing material that seals a periphery of the semiconductor chip such that a portion of the electrode is exposed; a rewiring layer formed on the sealing material and electrically connected to the electrode; an external connection electrode formed on the rewiring layer and electrically connected to the rewiring layer; and a polyimide layer disposed on the rewiring layer and around the external connection electrode, wherein the polyimide layer comprises a polycondensation unit of a tetracarboxylic dianhydride (α) and a diamine (β), the tetracarboxylic dianhydride (α) comprises an aromatic tetracarboxylic dianhydride (α1) having a benzophenone backbone, represented by the following formula (1), or the diamine (β) comprises an aromatic diamine (β1) having a benzophenone backbone, represented by the following formula (2),

[Formula 9]

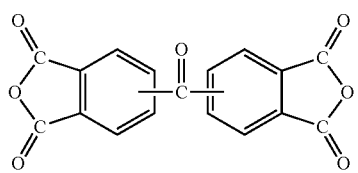

(1)

[Formula 10]

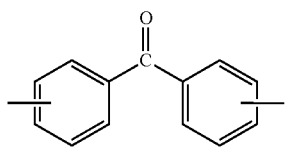

(2)

a total amount of the aromatic tetracarboxylic dianhydride (α1) and the aromatic diamine (β1) is 5 to 49 mol % based on a total amount of the tetracarboxylic dianhydride (α) and the diamine (β), the diamine (β) comprises an aliphatic diamine (β5) represented by the following formula (3) or (4),

[Formula 11]

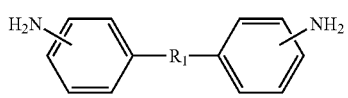

(3)

wherein in formula (3), $R_1$ is an aliphatic chain having a main chain containing any one or more atoms of C, N, and O, a total number of atoms constituting the main chain is 7 to 500, the aliphatic chain optionally further has a side chain containing any one or more atoms of C, N, H, and O, and a total number of atoms constituting the side chain is 10 or less,

[Formula 12]

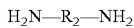

$H_2N-R_2-NH_2$ (4)

wherein in formula (4), $R_2$ is an aliphatic chain having a main chain containing any one or more atoms of C, N, and O, a total number of atoms constituting the main chain is 5 to 500, the aliphatic chain optionally further has a side chain containing any one or more atoms of C, N, H, and O, and a total number of atoms constituting the side chain is 10 or less, and the semiconductor apparatus comprises a polyimide having an amine equivalent of 4,000 to 20,000.

[21] The semiconductor apparatus according to [20], wherein the polyimide is such that the total amount of the aromatic tetracarboxylic dianhydride (α1) and the aromatic diamine (β1) is 5 to 30 mol % based on the total amount of the tetracarboxylic dianhydride (α) and the diamine (β), a total amount of a tetracarboxylic dianhydride and a diamine each not having any aliphatic chain having 3 or more carbon atoms in a main chain is 95 mol % or more based on the total amount of the tetracarboxylic dianhydride (α) and the diamine (β), the tetracarboxylic dianhydride (α) comprises an aromatic tetracarboxylic dianhydride (α2) not having a biphenyl backbone but having a diphenyl ether backbone, or the diamine (β) comprises an aromatic diamine (β2) not having a biphenyl backbone but having a diphenyl ether backbone, a total amount of the aromatic tetracarboxylic dianhydride (α2) and the aromatic diamine (β2) is 40 mol % or more and 95 mol % or less based on the total amount of the tetracarboxylic dianhydride (α) and the diamine (β), and a total amount of an aromatic tetracarboxylic dianhydride (α3) not having a biphenyl backbone but having a diphenyl ether backbone and having three or more aromatic rings, and an aromatic diamine (β3) not having a biphenyl backbone but having a diphenyl ether backbone and having three or more aromatic rings is 20 mol % or more based on the total amount of the tetracarboxylic dianhydride (α) and the diamine (β), the tetracarboxylic dianhydride (α) comprises an aromatic tetracarboxylic dianhydride (α4) having a biphenyl backbone, or the diamine (β) comprises an aromatic diamine (β4) having a biphenyl backbone, a total amount of the aromatic tetracarboxylic dianhydride (α4) and the aromatic diamine (β4) is 0 mol % or more and less than 45 mol % based on the total amount of the tetracarboxylic dianhydride (α) and the diamine (β), and the polyimide has a viscosity average molecular weight η of 0.6 or more and 1.60 or less.

Advantageous Effects of Invention

The method for manufacturing a semiconductor substrate of the present invention enables a non-circuit-formed face of a semiconductor wafer to be ground without dropping of such a semiconductor wafer in the grinding. Furthermore, the method for manufacturing a semiconductor substrate allows cracking and breaking to hardly occur on the resulting semiconductor substrate. The method for manufacturing a semiconductor apparatus of the present invention enables a semiconductor apparatus to be manufactured without the occurrence of any cracks or the like in a rewiring layer.

DESCRIPTION OF EMBODIMENTS

Figure 1A:
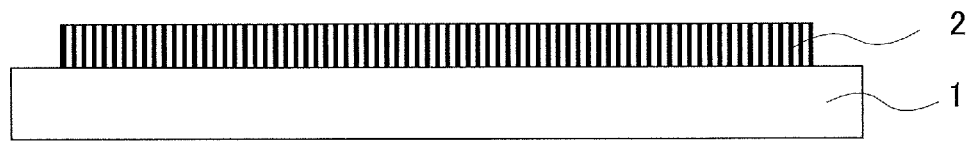
FIG. 1A to FIG. 1E illustrate a flowchart for illustrating one example of a method for manufacturing a semiconductor substrate.
Figure 1B:
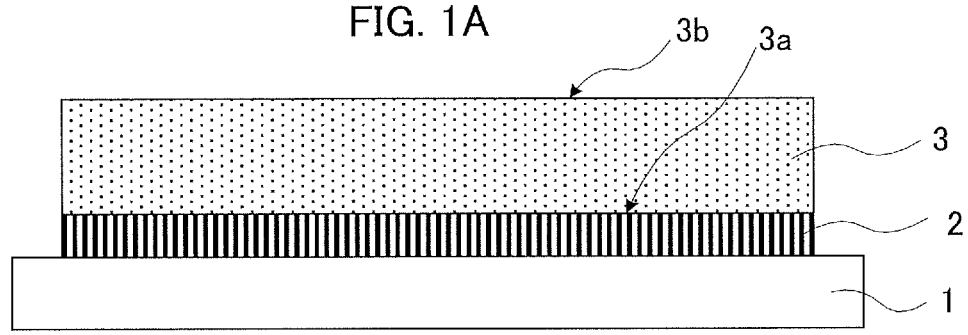
Figure 1C:
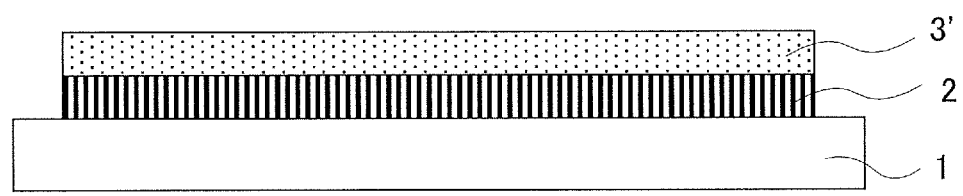
Figure 1D:
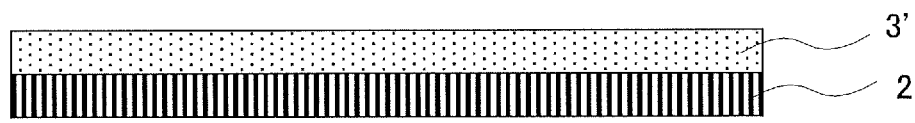
Figure 1E:
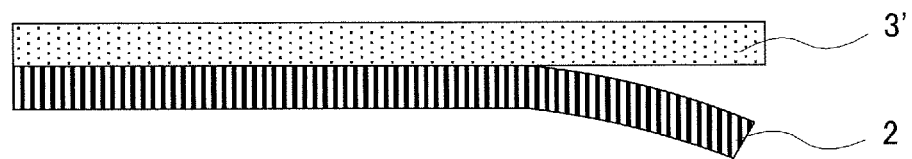
Figure 2A:
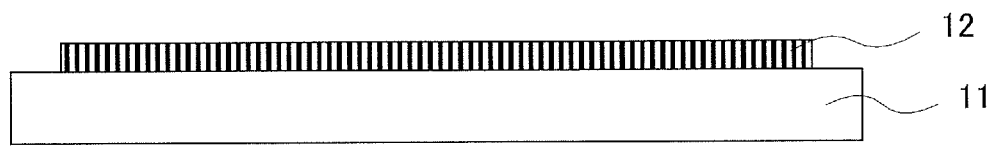
FIG. 2A to FIG. 2F illustrate a flowchart for illustrating one example of a method for manufacturing a semiconductor apparatus.
Figure 2B:
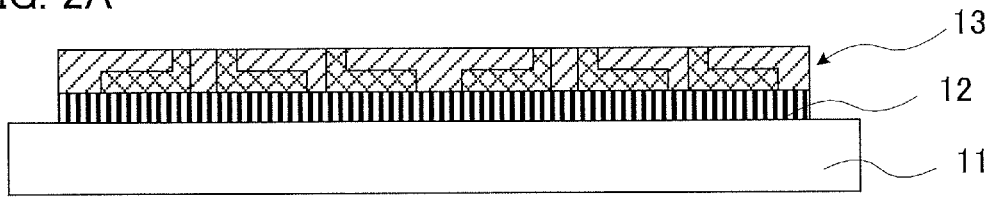
Figure 2C:
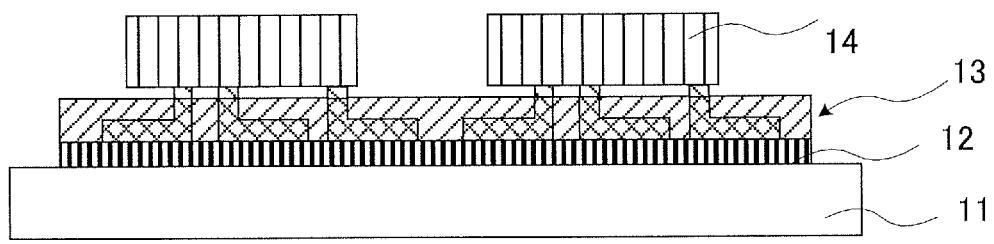
Figure 2D:
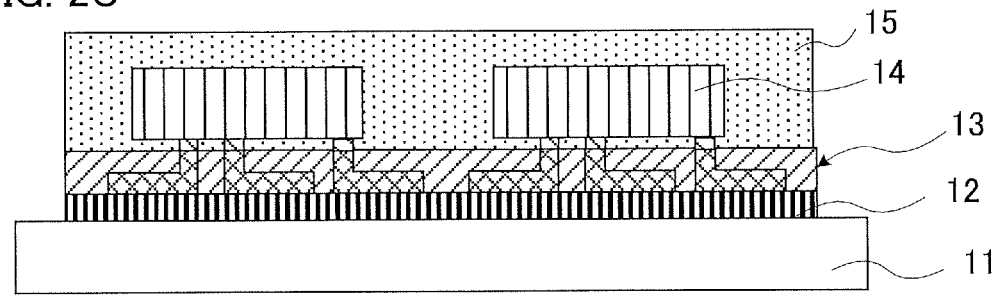
Figure 2E:
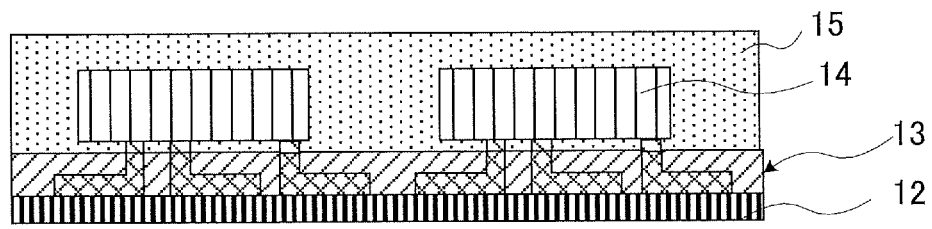
Figure 2F:
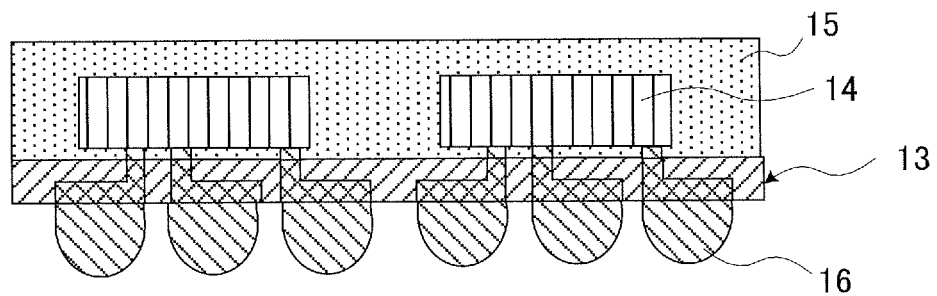

Herein, a numerical value range represented by use of "to" means a range including numerical values before and after "to" as a lower limit and an upper limit, respectively.

The present invention relates to a method for manufacturing a semiconductor substrate and a method for manufacturing a semiconductor apparatus, and both the methods include forming a polyimide layer including a specific polyimide, on a semiconductor wafer, or a support material that supports a member for a semiconductor apparatus. Such a polyimide for use in these manufacturing methods is first described, and thereafter the method for manufacturing a semiconductor substrate and the method for manufacturing a semiconductor apparatus are described.

1. Polyimide

A polyimide for use in a method for manufacturing a semiconductor substrate and a method for manufacturing a semiconductor apparatus, described below, includes a polycondensation unit of tetracarboxylic dianhydride (α) and diamine (β). The polyimide is made so that tetracarboxylic dianhydride (α) contains aromatic tetracarboxylic dianhydride (α1) having a benzophenone backbone, represented by the following formula (1), or diamine (β) contains aromatic diamine (β1) having a benzophenone backbone, represented by the following formula (2). The polyimide may contain both a structure derived from aromatic tetracarboxylic dianhydride (α1) and a structure derived from aromatic diamine (β1).

[Formula 13]

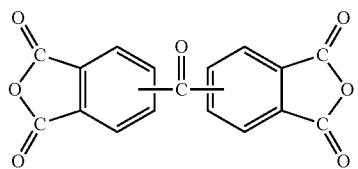

(1)

[Formula 14]

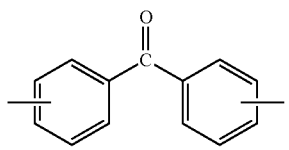

(2)

Specific examples of aromatic tetracarboxylic dianhydride (α1) having a benzophenone backbone, represented by formula (1), include 3,3',4,4'-benzophenonetetracarboxylic dianhydride, 2,3,3',4'-benzophenonetetracarboxylic dianhydride, and 2,2',3,3'-benzophenonetetracarboxylic dianhydride. Such aromatic tetracarboxylic dianhydride (α1) may be included in tetracarboxylic dianhydride (α) singly or in combinations of two or more kinds thereof.

Some of or all the hydrogen atoms on the aromatic ring of aromatic tetracarboxylic dianhydride (α1) may be substituted with a group selected from a fluoro group, a methyl group, a methoxy group, a trifluoromethyl group, a trifluoromethoxy group, and the like. Aromatic tetracarboxylic dianhydride (α1) may have a group serving as a crosslinking point selected from an ethynyl group, a benzoyclobuten-4'-yl group, a vinyl group, an allyl group, a cyano group, an isocyanate group, a nitrilo group, an isopropenyl group, and the like.

On the other hand, specific examples of aromatic diamine (β1) having a benzophenone backbone, represented by formula (2), include 3,3'-diaminobenzophenone, 3,4-diaminobenzophenone, 4,4'-diaminobenzophenone, 4,4'-bis[4-(4-amino-α,α-dimethylbenzyl)phenoxy]benzophenone, and a diamine represented by the following formula (2-1). Such aromatic diamine (β1) may be included in diamine (β) singly or in combinations of two or more kinds thereof.

[Formula 15]

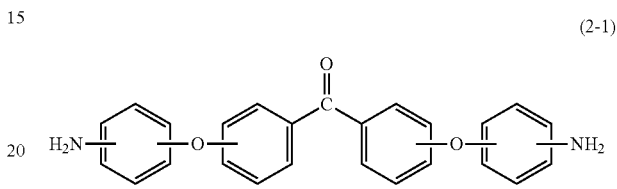

(2-1)

The total amount of aromatic tetracarboxylic dianhydride (α1) and aromatic diamine (β1) is 5 to 49 mol %, preferably 5 to 30 mol %, more preferably 9 to 30 mol %, further preferably 10 to 25 mol % based on the total amount of tetracarboxylic dianhydride (α) and diamine (β) that constitute the polyimide. In the case where the total amount of aromatic tetracarboxylic dianhydride (α1) and aromatic diamine (β1) is 5 mol % or more, the amount of a carbonyl group derived from the benzophenone backbone in the polyimide molecule is increased, resulting in an enhancement in heat resistance of the polyimide layer. Such an increase in the amount of a carbonyl group also results in an enhancement in the solubility of the polyimide in the polar solvent. On the other hand, in the case where the total amount of aromatic tetracarboxylic dianhydride (α1) and aromatic diamine (β1) is 49 mol % or less, gelation in dissolution of the polyimide in the solvent can be suppressed, for example.

On the other hand, diamine (β) also includes an aliphatic diamine containing an alkyleneoxy group, specifically, aliphatic diamine (β5) represented by the following formula (3) or (4). Diamine (β), which includes aliphatic diamine (β5), allows flexibility of the polyimide to be easily enhanced. Diamine (β), which includes aliphatic diamine (β5), also allows the solubility of the polyimide in the solvent to be improved, resulting in a decrease in the glass transition temperature (Tg). Diamine (β) may include only any one of or both aliphatic diamines (β5) represented by formula (3) and formula (4).

[Formula 16]

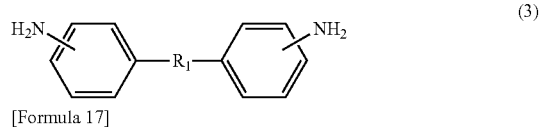

(3)

[Formula 17]

(4)

$R_1$ in formula (3) and $R_2$ in formula (4) represent an aliphatic chain having a main chain containing any one or more atoms of C, N, and O, preferably an aliphatic chain having a main chain including one or more C atoms. The total number of atoms constituting the main chain is 7 to 500 with respect to $R_1$, and is 5 to 500 with respect to $R_2$. Both the numbers are preferably 10 to 500, more preferably 21 to 300, further preferably 50 to 300. The main chain in $R_1$ in formula (3) refers to a chain containing any atoms other than atoms constituting a side chain in an aliphatic chain linking two phenyl groups at molecular ends, and the main chain in $R_2$ in formula (4) refers to a chain containing any atoms other than atoms constituting a side chain in an aliphatic chain linking two amino groups at molecular ends.

Examples of the main chain containing any one or more atoms of C, N, and O constituting the aliphatic chain include a chain having a structure derived from polyalkylenepolyamine such as diethylenetriamine, triethylenetetramine, or tetraethylenepentamine; a chain containing an alkylene group; a chain containing a polyalkylene glycol structure; a chain having an alkyl ether structure; a chain having a polyalkylene carbonate structure; and a chain containing an alkyleneoxy group or a polyalkyleneoxy group. In particular, a chain containing an alkyleneoxy group or a polyalkyleneoxy group is preferable.

The polyalkyleneoxy group refers to a divalent linking group including two or more alkyleneoxy groups as repeating units, and examples thereof include "—$(CH_2CH_2O)_n$—" with an ethyleneoxy unit as a repeating unit, and "—$(CH_2$—$CH(—CH_3)O)_m$—" with a propyleneoxy unit as a repeating unit (n and m each represent the number of repeating units). The number of alkyleneoxy units repeated in the polyalkyleneoxy group is preferably 2 to 50, more preferably 2 to 20, still more preferably 2 to 15. The polyalkyleneoxy group may include multiple kinds of alkyleneoxy units.

The respective numbers of carbon atoms in the alkylene group of the alkyleneoxy group and in the alkylene group included in the polyalkyleneoxy group are preferably 1 to 10, more preferably 2 to 10. Specific examples thereof include a methylene group, an ethylene group, a propylene group, and a butylene group. In particular, in the case where the alkyleneoxy group or the polyalkyleneoxy group includes a butylene group, the resulting polyimide layer is easily improved in mechanical strength.

The alkyleneoxy group or the polyalkyleneoxy group in the main chain of the aliphatic chain represented by $R_1$ or $R_2$ in formulae (3) and (4) may be bound to other linking group, and may be linked to, for example, an alkylene group, an arylene group, an alkylenecarbonyloxy group, or an arylenecarbonyloxy group. Such a group is preferably linked to an alkylene group particularly from the viewpoint of an enhancement in reactivity of a terminal amino group.

The aliphatic chain represented by $R_1$ and $R_2$ may further have a side chain containing any one or more atoms of C, N, H, and O. The side chain refers to a monovalent group linked to any atom constituting the main chain. The total number of atoms constituting such each side chain is preferably 10 or less. Examples of the side chain include an alkyl group such as a methyl group.

The aliphatic diamine represented by formula (3) is particularly preferably a compound represented by the following formula (3-1). On the other hand, the aliphatic diamine represented by formula (4) is particularly preferably a compound represented by the following formula (4-1).

[Formula 18]

(3-1)

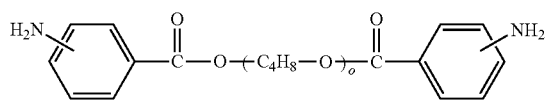

[Formula 19]

(4-1)

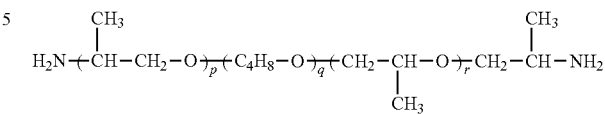

In formula (3-1), o represents an integer of 1 to 50, and is preferably an integer of 10 to 20.

In formula (4-1), p, q, and r each independently represent an integer of 0 to 10, provided that p+q+r equals to 1 or more, and is preferably 5 to 20.

The amount of aliphatic diamine (β5) represented by formula (3) or (4) (the total amount of the diamine represented by formula (3) or (4)) is preferably 10 mol % or more, more preferably 12 mol % or more, based on the amount of diamine (β) from the viewpoint of imparting high flexibility to the polyimide. On the other hand, the amount of aliphatic diamine (β5) is preferably 45 mol % or less based on the amount of diamine (β) from the viewpoint of not significantly deteriorating heat resistance of the polyimide.

Tetracarboxylic acid dianhydride (α) and diamine (β) may have, respectively, tetracarboxylic dianhydride and diamine, other than aromatic tetracarboxylic dianhydride (α1), aromatic diamine (β1), and aliphatic diamine (β5) described above. For example, such dianhydride and diamine may include a compound having an aromatic ring, other than the above, for an enhancement in heat resistance, and may include a compound having an aliphatic chain, other than the above, for an enhancement in flexibility.

Examples of other tetracarboxylic dianhydride include aromatic tetracarboxylic dianhydrides such as pyromellitic acid dianhydride, 3,3',4,4'-biphenyltetracarboxylic dianhydride, 1,1',2,2'-biphenyltetracarboxylic dianhydride, 2,3,2',3'-biphenyltetracarboxylic dianhydride, 1,2,2',3-biphenyltetracarboxylic dianhydride, bis(3,4-dicarboxyphenyl) ether dianhydride, bis(3,4-dicarboxyphenyl)sulfide dianhydride, bis(3,4-dicarboxyphenyl)sulfone dianhydride, bis(3,4-dicarboxyphenyl)methane dianhydride, 2,2-bis(3,4-dicarboxyphenyl)propane dianhydride, 2,2-bis(3,4-dicarboxyphenyl)-1,1,1,3,3,3-hexafluoropropane dianhydride, 1,3-bis(3,4-dicarboxyphenoxy)benzene dianhydride, 1,4-bis(3,4-dicarboxyphenoxy)benzene dianhydride, 4,4'-bis(3,4-dicarboxyphenoxy)biphenyl dianhydride, 2,2-bis[(3,4-dicarboxyphenoxy)phenyl]propane dianhydride, 2,3,6,7-naphthalenetetracarboxylic dianhydride, 1,4,5,8-naphthalenetetracarboxylic dianhydride, 2,2',3,3'-biphenyltetracarboxylic dianhydride, 2,2-bis(2,3-dicarboxyphenyl)propane dianhydride, 2,2-bis(2,3-dicarboxyphenyl)-1,1,1,3,3,3-hexafluoropropane dianhydride, bis(2,3-dicarboxyphenyl)ether dianhydride, bis(2,3-dicarboxyphenyl)sulfide dianhydride, bis(2,3-dicarboxyphenyl)sulfone dianhydride, 1,3-bis(2,3-dicarboxyphenoxy)benzene dianhydride, 1,4-bis(2,3-dicarboxyphenoxy)benzene dianhydride, 1,2,5,6-naphthalenetetracarboxylic dianhydride, 4,4'-isophthaloyl diphthalic anhydride, diazodiphenylmethane-3,3',4,4'-tetracarboxylic dianhydride, diazodiphenylmethane-2,2',3,3'-tetracarboxylic dianhydride, 2,3,6,7-thioxanthonetetracarboxylic dianhydride, 2,3,6,7-anthraquinonetetracarboxylic dianhydride, 2,3,6,7-xanthonetetracarboxylic dianhydride, and ethylenetetracarboxylic dianhydride.

Some of or all the hydrogen atoms on the aromatic ring of such an aromatic tetracarboxylic dianhydride may be substituted with a group selected from a fluoro group, a methyl group, a methoxy group, a trifluoromethyl group, a trifluoromethoxy group, and the like. Such an aromatic tetracarboxylic dianhydride may have a group serving as a cross-linking point selected from an ethynyl group, a benzoyclobuten-4'-yl group, a vinyl group, an allyl group, a cyano group, an isocyanate group, a nitrilo group, an isopropenyl group, and the like.

Examples of other tetracarboxylic dianhydride include tetracarboxylic dianhydrides having an alicyclic structure, such as cyclobutanetetracarboxylic dianhydride, 1,2,3,4-cyclopentanetetracarboxylic dianhydride, 1,2,4,5-cyclohexanetetracarboxylic dianhydride, bicyclo[2.2.1]heptane-2,3,5,6-tetracarboxylic dianhydride, bicyclo[2.2.2]oct-7-ene-2,3,5,6-tetracarboxylic dianhydride, bicyclo[2.2.2]octane-2,3,5,6-tetracarboxylic dianhydride, 2,3,5-tricarboxycyclopentylacetic dianhydride, bicyclo[2.2.1]heptane-2,3,5-tricarboxylic acid-6-acetic dianhydride, 1-methyl-3-ethylcyclohexa-1-ene-3-(1,2),5,6-tetracarboxylic dianhydride, 4-(2,5-dioxotetrahydrofuran-3-yl)-tetralin-1,2-dicarboxylic acid dianhydride, and 3,3',4,4'-dicyclohexyltetracarboxylic dianhydride.

On the other hand, examples of other diamine include aromatic diamines such as m-phenylenediamine, o-phenylenediamine, p-phenylenediamine, m-aminobenzylamine, p-aminobenzylamine, bis(3-aminophenyl)sulfide, (3-aminophenyl)(4-aminophenyl)sulfide, bis(4-aminophenyl)sulfide, bis(3-aminophenyl)sulfoxide, (3-aminophenyl)(4-aminophenyl)sulfoxide, bis(3-aminophenyl)sulfone, (3-aminophenyl)(4-aminophenyl)sulfone, bis(4-aminophenyl)sulfone, 3,3'-diaminodiphenylmethane, 3,4'-diaminodiphenylmethane, 4,4'-diaminodiphenylmethane, 4,4'-diaminodiphenyl ether, 3,3'-diaminodiphenyl ether, 3,4'-diaminodiphenyl ether, 3,3'-dimethylbenzidine, 3,4'-dimethylbenzidine, 4,4'-dimethylbenzidine, 2,2'-bis(trifluoromethyl)-1,1'-biphenyl-4,4'-diamine, 1,3-bis(3-aminophenoxy)benzene, 1,3-bis(4-aminophenoxy)benzene, 1,3-bis(3-(3-aminophenoxy)phenoxy)benzene, 1,3-bis(3-(4-aminophenoxy)phenoxy)benzene, 1,3-bis(4-(3-aminophenoxy)phenoxy)benzene, 1,3-bis(3-(3-aminophenoxy)phenoxy)-2-methylbenzene, 1,3-bis(3-(4-aminophenoxy)phenoxy)-4-methylbenzene, 1,3-bis(4-(3-aminophenoxy)phenoxy)-2-ethylbenzene, 1,3-bis(3-(2-aminophenoxy)phenoxy)-5-sec-butylbenzene, 1,3-bis(4-(3-aminophenoxy)phenoxy)-2,5-dimethylbenzene, 1,3-bis(4-(2-amino-6-methylphenoxy)phenoxy)benzene, 1,3-bis(2-(2-amino-6-ethylphenoxy)phenoxy)benzene, 1,3-bis(2-(3-aminophenoxy)-4-methylphenoxy)benzene, 1,3-bis(2-(4-aminophenoxy)-4-tert-butylphenoxy)benzene, 1,4-bis(3-(3-aminophenoxy)phenoxy)-2,5-di-tert-butylbenzene, 1,4-bis(3-(4-aminophenoxy)phenoxy)-2,3-dimethylbenzene, 1,4-bis(3-(2-amino-3-propylphenoxy)phenoxy)benzene, 1,2-bis(3-(3-aminophenoxy)phenoxy)-4-methylbenzene, 1,2-bis(3-(4-aminophenoxy)phenoxy)-3-n-butylbenzene, 1,2-bis(3-(2-amino-3-propylphenoxy)phenoxy)benzene, 4,4'-bis(4-aminophenyl)-1,4-diisopropylbenzene, 3,4'-bis(4-aminophenyl)-1,4-diisopropylbenzene, 3,3'-bis(4-aminophenyl)-1,4-diisopropylbenzene, bis[4-(3-aminophenoxy)phenyl]methane, bis[4-(4-aminophenoxy)phenyl]methane, 1,1-bis[4-(3-aminophenoxy)phenyl]ethane, 1,1-bis[4-(4-aminophenoxy)phenyl]ethane, 1,2-bis[4-(3-aminophenoxy)phenyl]ethane, 1,2-bis[4-(4-aminophenoxy)phenyl]ethane, 2,2-bis[4-(3-aminophenoxy)phenyl]propane, 2,2-bis[4-(4-aminophenoxy)phenyl]propane, 2,2-bis[4-(3-aminophenoxy)phenyl]butane, 2,2-bis[3-(3-aminophenoxy)phenyl]-1,1,1,3,3,3-hexafluoropropane, 2,2-bis[4-(4-aminophenoxy)phenyl]-1,1,1,3,3,3-hexafluoropropane, 4,4'-bis(3-aminophenoxy)biphenyl, 4,4'-bis(4-aminophenoxy)biphenyl, 3,3'-bis(4-aminophenoxy)biphenyl, bis[4-(3-aminophenoxy)phenyl]ketone, bis[4-(4-aminophenoxy)phenyl]ketone, bis[4-(3-aminophenoxy)phenyl]sulfide, bis[4-(4-aminophenoxy)phenyl]sulfide, bis[4-(3-aminophenoxy)phenyl]sulfoxide, bis[4-(4-aminophenoxy)phenyl]sulfoxide, bis[4-(3-aminophenoxy)phenyl]sulfone, bis[4-(4-aminophenoxy)phenyl]sulfone, 1,4-bis[4-(3-aminophenoxy)benzoyl]benzene, 1,3-bis[4-(3-aminophenoxy)benzoyl]benzene, 4,4'-bis[3-(4-aminophenoxy)benzoyl]diphenyl ether, 4,4'-bis[3-(3-aminophenoxy)benzoyl]diphenyl ether, 4,4'-bis[4-(4-amino-α,α-dimethylbenzyl)phenoxy]benzophenone, 4,4'-bis[4-(4-amino-(α,α-dimethylbenzyl)phenoxy]diphenylsulfone, bis[4-{4-(4-aminophenoxy)phenoxy}phenyl]sulfone, 1,4-bis[4-(4-aminophenoxy)-α,α-dimethylbenzyl]benzene, and 1,3-bis[4-(4-aminophenoxy)-α,α-dimethylbenzyl]benzene.

Examples of still other diamine include aliphatic diamines such as ethylenediamine, 1,3-diaminopropane, 1,4-diaminobutane, 1,5-diaminopentane, 1,6-diaminohexane, 1,7-diaminoheptane, 1,8-diaminooctane, 1,9-diaminononane, 1,10-diaminodecane, 1,11-diaminoundecane, and 1,12-diaminododecane.

Examples of yet other diamine include diamines having an alicyclic structure, such as cyclobutanediamine, 1,2-cyclohexanediamine, 1,3-cyclohexanediamine, 1,4-cyclohexanediamine, di(aminomethyl)cyclohexane (bis(aminomethyl)cyclohexane except for 1,4-bis(aminomethyl)cyclohexane), diaminobicycloheptane, diaminomethylbicycloheptane (including a norbornanediamine compound such as norbornanediamine), diaminooxybicycloheptane, diaminomethyloxybicycloheptane (including oxanorbornanediamine), isophoronediamine, diaminotricyclodecane, diaminomethyltricyclodecane, bis(aminocyclohexyl)methane (or methylenebis(cyclohexylamine)), and bis(aminocyclohexyl)isopropylidene.

The amine equivalent of the polyimide is 4,000 to 20,000, more preferably 4,500 to 18,000. The amine equivalent of the polyimide is defined as "Number average molecular weight of polyimide/Number of amino groups included in one molecule". Such amino groups included in one molecule include not only a terminal amino group, but also any other amino group. In the case where the amine equivalent falls within the above range, an amino group in the polyimide easily forms a hydrogen bond with a carbonyl group included in the benzophenone backbone in the polyimide, resulting in an enhancement in heat resistance of the polyimide.

The polyimide for use in the present invention can be prepared by polymerizing tetracarboxylic dianhydride (α) and diamine (β) by a known method. In order that the amine equivalent falls within the above range, namely, the amino group at a molecular end of the polyimide is increased, the molar number of diamine (β) for reaction may be allowed to be larger than the molar number of tetracarboxylic dianhydride (α) for reaction. Specifically, the compounding ratio (molar ratio) of tetracarboxylic dianhydride (α) and diamine (β) constituting the polyimide preferably satisfies α/β=0.8 or more and less than 1.0, more preferably 0.95 to 0.999. In the case where the compounding ratio is 1.0 or more, an amino group cannot be at a molecular end, and it is difficult to sufficiently form a hydrogen bond of a carbonyl group derived from the benzophenone backbone and an amino group.

The weight average molecular weight (Mw) of the polyimide is preferably 50,000 or more and 1,000,000 or less. In the case where the weight average molecular weight is 50,000 or more and 1,000,000 or less, a polyimide layer described below is easily enhanced in mechanical strength. The weight average molecular weight is more preferably 100,000 or more, particularly preferably 120,000 or more. The weight average molecular weight is more preferably 500,000 or less, particularly preferably 300,000 or less.

The number average molecular weight (Mn) of the polyimide is preferably 500 to $2.0 \times 10^6$, more preferably $4.0 \times 10^3$ to $2.4 \times 10^4$. The weight average molecular weight and the number average molecular weight of the polyimide can be measured by gel permeation chromatography (GPC).

The Mw/Mn ratio is preferably 5 or more and 100 or less. In the case where the Mw/Mn ratio falls within the above range, the solubility of the polyimide in the solvent and mechanical strength of a polyimide layer described below are easily well-balanced. The Mw/Mn ratio is more preferably 10 or more, particularly preferably 12 or more. The Mw/Mn ratio is more preferably 50 or less, particularly preferably 30 or less.

One example of a preferable polyimide, as the above polyimide, includes any polyimide satisfying the following requirements a) to e). Herein, tetracarboxylic dianhydride (α) constituting the polyimide may include the following tetracarboxylic dianhydrides other than aromatic tetracarboxylic dianhydrides (α1) to (α4). Similarly, diamine (β) constituting the polyimide may include the following diamines other than aromatic diamines (β1) to (β4).

Requirement a): the total amount of aromatic tetracarboxylic dianhydride (α1) and aromatic diamine (β1) is 5 to 30 mol % based on the total amount of tetracarboxylic dianhydride (α) and diamine (β).

Requirement b): the total amount of a tetracarboxylic dianhydride and a diamine each not having any aliphatic chain having 3 or more carbon atoms in a main chain is 95 mol % or more based on the total amount of tetracarboxylic dianhydride (α) and diamine (β).

Requirement c): tetracarboxylic dianhydride (α) includes aromatic tetracarboxylic dianhydride (α2) not having a biphenyl backbone but having a diphenyl ether backbone, or diamine (β) includes aromatic diamine (β2) not having a biphenyl backbone but having a diphenyl ether backbone, the total amount of aromatic tetracarboxylic dianhydride (α2) and aromatic diamine (β2) is 40 mol % or more and 95 mol % or less based on the total amount of tetracarboxylic dianhydride (α) and diamine (β), and the total amount of aromatic tetracarboxylic dianhydride (α3) not having a biphenyl backbone but having a diphenyl ether backbone and having three or more aromatic rings, and aromatic diamine (β3) not having a biphenyl backbone but having a diphenyl ether backbone and having three or more aromatic rings is 20 mol % or more based on the total amount of tetracarboxylic dianhydride (α) and diamine (β).

Requirement d): tetracarboxylic dianhydride (α) includes aromatic tetracarboxylic dianhydride (α4) having a biphenyl backbone, or diamine (β) includes aromatic diamine (β4) having a biphenyl backbone, and the total amount of aromatic tetracarboxylic dianhydride (α4) and aromatic diamine (β4) is 0 mol % or more and less than 45 mol % based on the total amount of tetracarboxylic dianhydride (α) and diamine (β).

Requirement e): the viscosity average molecular weight η is 0.6 or more and 1.60 or less.

Requirement a)

In the case where the total amount of aromatic tetracarboxylic dianhydride (α1) and aromatic diamine (β1) is 5 mol % or more based on the total amount of tetracarboxylic dianhydride (α) and diamine (β), heat resistance of the polyimide and the solubility of the polyimide in the solvent are easily enhanced as described above. On the other hand, in the case where the total amount of aromatic tetracarboxylic dianhydride (α1) and aromatic diamine (β1) is 30 mol % or less, stability of the polyimide is easily enhanced.

Requirement b)

In the case where the total amount of a tetracarboxylic dianhydride and a diamine each not having any aliphatic chain having 3 or more carbon atoms in a main chain is 95 mol % or more based on the total amount of tetracarboxylic dianhydride (α) and diamine (β), very high heat resistance of the polyimide is achieved. The main chain refers to a structure including a polycondensation unit of tetracarboxylic dianhydride (α) and diamine (β), formed between both ends of the polyimide molecule, provided that any atom constituting a side chain is excluded. Such a side chain optionally includes an aliphatic chain having 3 or more carbon atoms, but preferably includes no aliphatic chain having 3 or more carbon atoms in the case where the polyimide is required to have very high heat resistance.

Requirement c)

In the case where tetracarboxylic dianhydride (α) includes aromatic tetracarboxylic dianhydride (α2) not having a biphenyl backbone but having a diphenyl ether backbone, or diamine (β) includes aromatic diamine (β2) not having a biphenyl backbone but having a diphenyl ether backbone, a very high solubility of the polyimide in the solvent is achieved. Aromatic diamine (β2) may partially correspond to aromatic diamine (β1), and the compound is made in consideration of both requirement a) and requirement c) in such a case.

In particular, in the case where the total amount of aromatic tetracarboxylic dianhydride (α2) and aromatic diamine (β2) is 40 mol % or more and 95 mol % or less based on the total amount of tetracarboxylic dianhydride (α) and diamine (β), and furthermore the total amount of aromatic tetracarboxylic dianhydride (α3) having three or more aromatic rings, in aromatic tetracarboxylic dianhydride (α2), and aromatic diamine (β3) having three or more aromatic rings, in aromatic diamine (β2), is 20 mol % or more, the solubility of the polyimide in the solvent is further easily enhanced.

Examples of aromatic tetracarboxylic dianhydride (α3) here include 4,4'-(4,4'-isopropylidenediphenoxy)bisphthalic anhydride, 1,3-bis(3,4-dicarboxyphenoxy)benzene dianhydride, and 1,4-bis(3,4-dicarboxyphenoxy)benzene dianhydride. Examples of aromatic tetracarboxylic dianhydride (α2) other than aromatic tetracarboxylic dianhydride (α3) include 4,4'-oxydiphthalic anhydride.

On the other hand, examples of aromatic diamine (β3) include bis[4-(3-aminophenoxy)phenyl]sulfide, 1,3-bis(3-aminophenoxy)benzene, 1,3-bis(4-aminophenoxy)benzene, 1,3-bis(3-(3-aminophenoxy)phenoxy)benzene, 1,3-bis(3-(4-aminophenoxy)phenoxy)benzene, 1,3-bis(4-(3-aminophenoxy)phenoxy)benzene, 1,3-bis(3-(3-aminophenoxy)phenoxy)-2-methylbenzene, 1,3-bis(3-(4-aminophenoxy)phenoxy)-4-methylbenzene, 1,3-bis(4-(3-aminophenoxy)phenoxy)-2-ethylbenzene, 1,3-bis(3-(2-aminophenoxy)phenoxy)-5-sec-butylbenzene, 1,3-bis(4-(3-aminophenoxy)phenoxy)-2,5-dimethylbenzene, 1,3-bis(4-(2-amino-6-methylphenoxy)phenoxy)benzene, 1,3-bis(2-(2-amino-6-ethylphenoxy)phenoxy)benzene, 1,3-bis(2-(3-aminophenoxy)-4-methylphenoxy)benzene, 1,3-bis(2-(4-aminophenoxy)-4-tert-butylphenoxy)benzene, 1,4-bis(3-(3-aminophenoxy)phenoxy)-2,5-di-tert-butylbenzene, 1,4-bis(3-(4-aminophenoxy)phenoxy)-2,3-dimethylbenzene, 1,4-bis(3-(2-amino-3-propylphenoxy)phenoxy)benzene, 1,2-bis (3-(3-aminophenoxy)phenoxy)-4-methylbenzene, 1,2-bis(3-(4-aminophenoxy)phenoxy)-3-n-butylbenzene, 1,2-bis(3-(2-amino-3-propyl)phenoxy)benzene, 4,4'-bis(4-aminophenyl)-1,4-diisopropylbenzene, bis[4-(3-aminophenoxy)phenyl]methane, bis[4-(4-aminophenoxy)phenyl]methane, 2,2-bis[4-(3-aminophenoxy)phenyl]propane, 2,2-bis[4-(4-aminophenoxy)phenyl]propane, 2,2-bis[3-(3-aminophenoxy)phenyl]-1,1,1,3,3,3-hexafluoropropane, 2,2-bis[4-(4-aminophenoxy)phenyl]-1,1,1,3,3,3-hexafluoropropane, bis[4-(4-aminophenoxy)phenyl]ketone, bis[4-(4-aminophenoxy)phenyl]sulfide, bis[4-(3-aminophenoxy)phenyl]sulfoxide, bis[4-(aminophenoxy)phenyl]sulfoxide, bis[4-(3-aminophenoxy)phenyl]sulfone, bis[4-(4-aminophenoxy)phenyl]sulfone, 1,4-bis[4-(3-aminophenoxy)benzoyl]benzene, 1,3-bis[4-(3-aminophenoxy)benzoyl]benzene, 4,4'-bis[3-(4-aminophenoxy)benzoyl]diphenyl ether, and 4,4'-bis[3-(3-aminophenoxy)benzoyl]diphenyl ether. In particular, 1,3-bis(3-aminophenoxy)benzene, 1,3-bis(4-aminophenoxy)benzene, and 2,2-bis[4-(4-aminophenoxy)phenyl]propane are preferable.

Examples of aromatic diamine (β2) other than aromatic diamine (β3) include 4,4'-diaminodiphenyl ether, 3,3'-diaminodiphenyl ether, and 3,4'-diaminodiphenyl ether.

Requirement d)

In the case where tetracarboxylic dianhydride (α) includes aromatic tetracarboxylic dianhydride (α4) having a biphenyl backbone, or diamine (β) includes aromatic diamine (β4) having a biphenyl backbone, and the total amount of aromatic tetracarboxylic dianhydride (α4) and aromatic diamine (β4) is 0 mol % or more and less than 45 mol % based on the total amount of tetracarboxylic dianhydride (α) and diamine (β), heat resistance of the polyimide is enhanced. Aromatic diamine (β4) may partially correspond to aromatic diamine (β1). In such a case, the compound is made in consideration of both requirement a) and requirement d).

Examples of aromatic tetracarboxylic dianhydride (α4) include 3,3',4,4'-biphenyltetracarboxylicdianhydride, 2,3',3,4'-biphenyltetracarboxylicdianhydride, 4,4'-bis(3,4-dicarboxyphenoxy)biphenyldianhydride, and 2,2',3,3'-biphenyltetracarboxylic dianhydride.

On the other hand, examples of aromatic diamine (β4) include 4,4'-bis(3-aminophenoxy)biphenyl, 4,4'-bis(4-aminophenoxy)biphenyl, 3,3'-bis(4-aminophenoxy)biphenyl, 4,4'-bis(4-aminophenoxy)biphenyl, 2,2'-bis(trifluoromethyl)-1,1'-biphenyl-4,4'-diamine, 3,3'-dimethylbenzidine, 3,4'-dimethylbenzidine, and 4,4'-dimethylbenzidine.

Requirement e)

In the case where the viscosity average molecular weight η of the polyimide is 0.6 or more, mechanical strength of a polyimide layer described below is easily enhanced. On the other hand, in the case where the viscosity average molecular weight is 1.60 or less, the solubility of the polyimide in the solvent is increased. The viscosity average molecular weight η herein is defined as a value calculated from the following method. A small amount of a polyimide to be subjected to measurement is taken in a conical flask, and diluted with N-methylpyrrolidone (NMP) so that the concentration is 0.5 (g/dL). A diluted varnish prepared is then subjected to plunge time measurement with an ubbelohde tube (manufactured by Sibata Scientific Technology Ltd.) placed in a constant-temperature bath at 35° C. A value here determined according to η=ln [plunge time of diluted varnish/plunge time of NMP] is defined as the viscosity average molecular weight η. The viscosity average molecular weight η is more preferably 0.7 or more, further preferably 0.8 or more. On the other hand, the viscosity average molecular weight η is more preferably 1.4 or less from the viewpoint of the solubility of the polyimide in the solvent.

2. Method for Manufacturing Semiconductor Substrate

The method for manufacturing a semiconductor substrate of the present invention will be described. As described above, a known method for manufacturing a semiconductor substrate is a procedure which involves grinding a non-circuit-formed face of a semiconductor wafer with a circuit-formed face of the semiconductor wafer being supported by a support material, and a layer of polyimide is known as an adhesion layer for bonding a semiconductor wafer and a support material. A conventional adhesion layer (hereinafter, also referred to as "polyimide layer") has been formed by coating a support material with a polyamide acid-containing varnish. Such a polyimide layer, however, causes water generated in imidization of polyamide acid to easily remain as air bubbles in the layer. Such a polyimide layer, when including air bubbles, has the problems of causing a semiconductor wafer to be dropped in grinding of the semiconductor wafer, and of causing any uneven load to be applied in grinding of the semiconductor wafer, resulting in cracking and/or breaking, for example.

In the case where the non-circuit-formed face of the semiconductor wafer is subjected to various treatments after grinding of the semiconductor wafer, heat is also applied to the polyimide layer. The polyimide layer, when here including air bubbles, causes air bubbles to be expanded by the heat, and causes the semiconductor wafer to be under any load. As a result, the semiconductor wafer may be released or warped and broken. Furthermore, such a conventional polyimide also has the problem of being required to be at high temperatures in bonding with the semiconductor wafer, because of a high glass transition temperature (Tg).

On the contrary, the method for manufacturing a semiconductor substrate of the present invention allows a support material and a circuit-formed face of a semiconductor wafer to be bonded by a polyimide layer including the polyimide. The polyimide includes a benzophenone backbone, and thus is high in solubility in the solvent. Accordingly, for example, the polyimide can be dissolved in the solvent and thus subjected to coating of the support material, and enables the polyimide layer to be formed without the occurrence of any air bubbles. In other words, the method of the present invention allows adhesiveness of the polyimide layer and the semiconductor wafer to be very favorable, does not cause, for example, dropping of the semiconductor wafer in grinding of the non-circuit-formed face of the semiconductor wafer, and furthermore does not cause the occurrence of any cracking and breaking.

The polyimide has a relatively low glass transition temperature. Thus, a polyimide sheet prepared in advance can also be, for example, bonded to the support material at a relatively low temperature and formed into the polyimide layer. An advantage is also that the semiconductor wafer and the polyimide layer can be bonded at a relatively low temperature.

The polyimide has a relatively low glass transition temperature (Tg), but is high in heat resistance as described above. Accordingly, the polyimide can be less decomposed and can allow the semiconductor wafer to be strongly retained, even in the case where the non-circuit-formed face of the semiconductor wafer is subjected to each processing with the semiconductor wafer and the polyimide layer being bonded.

The method for manufacturing a semiconductor wafer of the present invention includes at least forming a polyimide layer on a support material, bonding the support material and a circuit-formed face of a semiconductor wafer with the polyimide layer being interposed therebetween, grinding a non-circuit-formed face of the semiconductor wafer, releasing the support material from the polyimide layer, and releasing the polyimide layer from the wafer.

The method for manufacturing a semiconductor wafer of the present invention may include any operation other than the above, and may further include, for example, forming an unevenness absorbing layer on the polyimide layer after the polyimide layer formation and before the wafer bonding, and processing the non-circuit-formed face of the wafer after the wafer grinding.

Hereinafter, each operation of the method for manufacturing a semiconductor wafer of the present invention will be described.

2-1. Polyimide Layer Formation

The polyimide layer formation of the present invention is for forming a polyimide layer on a support material.

The support material that allows the polyimide layer to be formed is not particularly limited as long as the support material is a member that has a smooth surface and that can provide supporting in grinding of the non-circuit-formed face of the semiconductor wafer without the occurrence of any warpage on the semiconductor wafer. The type of the support material is appropriately selected depending on the method of forming the polyimide layer in the present formation, and the method of releasing the support material in support material releasing described below. For example, in the case where the polyimide layer is formed by coating of a vanish including polyimide and a solvent in the present formation and/or in the case where the polyimide layer is partially dissolved with a solvent in support material releasing described below, a support material having sufficient resistance to such a solvent is selected. In the case where irradiation with laser light is made with the support material being interposed, to thereby release the support material, in support material releasing described below, a support material high in permeability to laser light is selected.

In the present invention, a support material made of glass is particularly preferably used from the viewpoint of high solvent resistance, high permeability to laser light and furthermore high heat resistance. An alkali-free glass or quartz glass support material is further preferably used because such a material is higher in permeability. The shape and the thickness of the support material can be appropriately selected depending on the size of a semiconductor wafer to be ground, the desired strength, and the like.

On the other hand, the method for forming the polyimide layer is not particularly limited as long as the method is a method that can form a smooth layer without the occurrence of any air bubbles in the resulting polyimide layer. As described above, a method may also be adopted which includes preparing a varnish including polyimide dissolved in a solvent, coating a support material with the varnish, and drying the resultant. On the other hand, a method may also be adopted which includes producing a polyimide film including polyimide in advance, and bonding the polyimide film to a support material.

The polyimide layer formed in the present formation may be a layer including only the polyimide, or may include other resin than the polyimide, and various additives, fillers, and the like as long as the effect of the present invention is not impaired.

In the case where the polyimide layer is formed by coating with the varnish including the polyimide, the solvent for dissolving the polyimide is not particularly limited as long as the solvent can dissolve the polyimide, and examples thereof include polar solvents such as N-methyl-2-pyrrolidone (NMP), dimethylacetamide (DMAc), dimethylformamide (DMF), dimethylimidazolidinone (DMI), trimethylbenzene, toluene, and xylene. In particular, NMP, DMI, and DMAc are preferable. The concentration of the polyimide in the varnish is not particularly limited, can be freely set as long as any solubility is exhibited depending on the intended thickness, and is preferably 0.1 to 50 mass %, more preferably 1 to 35 mass %. In the case where the concentration of the polyimide in the varnish is 35 mass % or less, fluidity of the varnish is improved and a polyimide layer having a uniform thickness is easily obtained. The "dissolvable in a solvent" with respect to the polyimide in the present invention refers to dissolution of 0.1 mass % or more of the polyimide based on 100 mass % of a solvent including N-methyl-2-pyrrolidone.

The viscosity of the varnish is here preferably 100 to 10,000 mPa·s, more preferably 500 to 3,000 mPa·s. The viscosity of the varnish preferably falls within the range because a substrate is uniformly coated with the varnish. The viscosity is a value obtained by measurement at 25° C. according to an E-type viscosity measurement method.

The method for coating the support material with the varnish is not particularly limited, and a known procedure such as spin coating, slit coating, dye screen coating, screen printing, or dispenser coating can be adopted. The drying temperature and the drying time of the varnish are appropriately selected depending on the type and the amount of the solvent included in the varnish.

On the other hand, in the case where a polyimide sheet is produced in advance and the polyimide sheet is bonded, such a polyimide sheet is obtained by coating a release film with the varnish including the polyimide and the solvent, and drying the resultant. The polyimide sheet formed on the release film, and the support material are subjected to pressure bonding, and then the release film is released. Thus, the polyimide layer can be efficiently formed on the support material. The temperature in bonding of the polyimide sheet and the support material is preferably 80 to 250° C., more preferably 100 to 220° C. The temperature in the bonding can be 80° C. or more, thereby allowing the polyimide sheet to adhere to the support material. On the other hand, the temperature in the bonding can be 250° C. or less, thereby allowing for the bonding at high productivity.

The thickness of the polyimide layer to be formed in the present formation is preferably 1 to 500 μm, more preferably 1 to 50 μm. A too large thickness of the polyimide layer may cause the solvent for use in the formation of the polyimide layer to be hardly extracted from the polyimide layer, thereby causing voids to occur in the polyimide layer. On the other hand, a too small thickness of the polyimide layer may cause adhesiveness to the support material or the semiconductor wafer not to be sufficiently achieved.

The glass transition temperature of the polyimide layer to be formed in the present formation is 210° C. or less, more preferably 100 to 210° C. The glass transition temperature of the polyimide layer of less than 260° C. allows bonding of the support material and the semiconductor wafer in wafer bonding described below to be performed at a relatively low temperature. The glass transition temperature (Tg) of the polyimide layer can be adjusted depending on the structure of the polyimide (tetracarboxylic dianhydride (α) and diamine (β)).

The glass transition temperature of the polyimide layer can be measured by the following method. A varnish for use in formation of the polyimide layer is used to prepare a film made of the polyimide, having a thickness of 50 μm. Temperature diffusion measurement of the solid viscoelasticity of the film is performed in a tensile mode under a condition of a measurement frequency of 1 Hz, and the storage elastic modulus E' and the loss elastic modulus E" are measured. The peak value of the resulting loss tangent tan δ=E"/E' is defined as "glass transition temperature".

2-2. Unevenness Absorbing Layer Formation

After the polyimide layer formation, unevenness absorbing layer formation may also be performed. An unevenness absorbing layer can be formed on the polyimide layer, thereby absorbing unevenness (for example, unevenness due to an electrode, bump, and a solder ball) on a circuit-formed face of a semiconductor wafer to be bonded to the support material. Thus, adhesiveness of the support material and the semiconductor wafer can be enhanced, thereby inhibiting the semiconductor wafer from being dropped in grinding of the semiconductor wafer, and/or inhibiting the semiconductor wafer from being broken due to local application of any load.

While a known resin can be used for the unevenness absorbing layer depending on the object, the layer is preferably a layer made of a resin relatively low in elastic modulus, and examples of such a resin include an α-olefin homopolymer mainly containing $C_{2-12}$ α-olefin as a structural unit, or a copolymer thereof. Examples of the $C_{2-12}$ α-olefin include ethylene, propylene, 1-butene, 1-pentene, 3-methyl-1-butene, 1-hexene, 4-methyl-1-pentene, 3-methyl-1-pentene, 1-heptene, 1-octene, 1-decene, and 1-dodecene.

In particular, examples include, but are not limited thereto, preferably ethylene-α-olefin copolymers such as an ethylene-propylene copolymer, an ethylene-1-butene copolymer, and an ethylene-propylene-$C_{4-12}$ α-olefin terpolymer; and a propylene-1-butene-$C_{5-12}$ α-olefin terpolymer, more preferably an ethylene-propylene copolymer, because these are excellent in followability to unevenness on the circuit-formed face of the semiconductor wafer.

The unevenness absorbing layer may include other polymer and/or other additive as long as bonding ability, unevenness fillability, releasability, and the like with respect to the semiconductor wafer are not impaired. Examples of such an additive include an ultraviolet polymerization initiator, a thermal polymerization initiator, a curing agent, and a tackifier.

The method for forming the unevenness absorbing layer is not particularly limited, and can be, for example, a method including coating the polyimide layer with a varnish including the resin and a solvent according to screen printing, dispenser coating or the like, and drying the resultant.

The thickness of the unevenness absorbing layer is preferably larger than the size of a step provided on the circuit-formed face of the semiconductor wafer, further preferably larger than the desired thickness of the semiconductor wafer (thickness of the semiconductor wafer after grinding). Thus, grinding described below can be performed with the semiconductor wafer being mostly filled in the unevenness absorbing layer, and breaking and/or cracking at an edge of the semiconductor wafer can be suppressed.

A known resin layer may also be formed on the polyimide layer—the upper surface of unevenness absorbing layer for the purpose of enhancing bonding ability, unevenness fillability, and releasability with respect to the semiconductor wafer.

2-3. Wafer Bonding

Subsequently, the support material and the circuit-formed face of the semiconductor wafer are bonded with the above polyimide layer being interposed therebetween. In the case where the unevenness absorbing layer is formed on the polyimide layer, the support material and the semiconductor wafer are bonded with the polyimide layer and the unevenness absorbing layer being interposed therebetween.

The method for bonding the semiconductor wafer and the support material is not particularly limited, and, for example, a known vacuum bonding apparatus can be used. For example, any one of the support material and the semiconductor wafer is secured and the other is disposed so as to face such any one. The resultant can be subjected to adhesion under pressure, and thus bonded.

The temperature of the polyimide layer in bonding of the semiconductor wafer is preferably 80 to 260° C., more preferably 100 to 220° C. As described above, the polyimide layer has a relatively low glass transition temperature. Accordingly, the polyimide layer can be allowed to sufficiently adhere to the semiconductor wafer even at the temperature. The pressurizing time is preferably 1 to 120 minutes, more preferably 1 to 60 minutes. In the case where the pressurizing time falls within the range, adhesiveness to the circuit-formed face of the semiconductor wafer can be sufficiently enhanced, and the semiconductor wafer in grinding can be inhibited from being dropped.

2-4. Wafer Grinding

The non-circuit-formed face of the semiconductor wafer is ground with the circuit-formed face being supported by the support material. The method for grinding the semiconductor wafer can be a known method, and may be any grinding system of a through-feed system and an infeed system. Both such methods include grinding until the semiconductor wafer has a desired thickness with water being fed between the semiconductor wafer and a grinding stone.

2-5. Wafer Processing

In the method for manufacturing a semiconductor substrate of the present invention, if necessary, processing of the non-circuit-formed face of the semiconductor wafer may be performed, and the non-circuit-formed face may be processed at a temperature of 100° C. or more. One example of such processing includes forming a thin film of metal such as copper or aluminum on the non-circuit-formed face (so-called back metal formation).

For example, in the case of such back metal formation, such a thin film of metal is formed on the non-circuit-formed face of the semiconductor wafer according to a sputtering method, a vapor deposition method, plating, a chemical vapor deposition method (CVD), or the like. Such formation may cause the temperatures of the semiconductor wafer, the polyimide layer, the support material, and the like to be about 300 to 400° C. in some cases. Thus, if a polyimide layer contains air bubbles, the air bubbles may be expanded, thereby causing the support material and the semiconductor wafer (or the unevenness absorbing layer) to be released, and/or causing warpage of the semiconductor wafer to occur. On the contrary, the polyimide layer to be formed in the polyimide layer formation hardly contains air bubbles. Accordingly, the semiconductor wafer is less dropped and the semiconductor wafer is less broken even at temperature rise of the polyimide layer and the like in the present processing.

2-6. Support Material Releasing

The support material is released from the polyimide layer in support material releasing. The method for releasing the support material from the polyimide layer is preferably a method in which stress is hardly applied to the semiconductor wafer, from the viewpoint of prevention of breaking of the semiconductor wafer.

Such a releasing method is preferably a method including irradiating the polyimide layer with laser light through the support material, thereby sublimating, dissolving, or decomposing at least a part of the polyimide layer facing the support material, to release the support material, or a method including feeding a solvent to an interface between the support material and the polyimide layer, thereby dissolving the polyimide layer facing the support material, to release the support material.

In the case of irradiation with laser light through the support material, the type of the laser light is not particularly limited as long as such laser light is any light which can sublimate, fuse, or decompose the polyimide layer. The laser light can be, for example, excimer light.

On the other hand, in the case where a solvent is fed to an interface between the support material and the polyimide layer, the feeding method is not particularly limited, and can be, for example, a known method including forming a though-hole on a support material and spraying a solvent or immersing the resultant in a solvent for rapid dissolution. The solvent here used is not particularly limited as long as the solvent can dissolve the polyimide and does not have any effect on the semiconductor wafer (semiconductor substrate) after grinding. Such a solvent can be, for example, a polar solvent for use in production of the polyimide layer.

The polyimide layer may be fully removed in the present releasing depending on the object (the present releasing may also simultaneously serve as releasing of the polyimide layer, described below), or the polyimide layer may be only partially removed and separately released in polyimide layer releasing described below.

2-7. Polyimide Layer Releasing

After the support material releasing, the polyimide layer is released from the circuit-formed face of the semiconductor wafer. In the case where the unevenness absorbing layer is interposed between the polyimide layer and the semiconductor wafer, the unevenness absorbing layer can also be released together with the polyimide layer.

The method for releasing the polyimide layer and the unevenness absorbing layer is not particularly limited, and can be, for example, a method including gripping partially or fully the polyimide layer and the unevenness absorbing layer and pulling them in a certain direction for releasing with, if necessary, warming to 15 to 100° C., preferably 20 to 80° C. The gripping method is not particularly limited, and a known method, namely, a releasing tape and/or a suction nozzle may be used.

The above operations provide a semiconductor substrate in which the non-circuit-formed face of the semiconductor wafer is ground (and processed).

3. Method for Manufacturing Semiconductor Apparatus

Next, the method for manufacturing a semiconductor apparatus of the present invention will be described. As described above, a known method for manufacturing a semiconductor apparatus is a method for manufacturing a semiconductor apparatus by forming a rewiring layer on a support material on which an adhesion layer is formed, and mounting a semiconductor chip on the rewiring layer, and a layer of polyimide is known as the adhesion layer for use in such a method. The adhesion layer for use in such a method (hereinafter, also referred to as "polyimide layer") has also been usually formed by coating a support material with a polyamide acid-containing varnish. As described above, such a polyimide layer causes water generated in imidization of polyamide acid to easily remain as air bubbles in the layer. Such a known method for manufacturing a semiconductor apparatus is required to involve formation of a rewiring layer, mounting of a semiconductor chip, and sealing of a semiconductor chip, and such operations cause any heat to be applied to such polyimide layer and support material. Such a polyimide layer, when including air bubbles, thus causes air bubbles to be expanded in such operations, resulting in the occurrence of cracks on the rewiring layer, and/or releasing of the rewiring layer.

On the contrary, the method for manufacturing a semiconductor apparatus of the present invention involves formation of a polyimide layer including the polyimide on a support material. The polyimide includes a benzophenone backbone, and thus is high in solubility in a solvent. Accordingly, for example, the polyimide can be dissolved in the solvent and thus subjected to coating of the support material, and enables the polyimide layer to be formed without the occurrence of any air bubbles. In other words, the method of the present invention hardly causes the occurrence of cracks in the rewiring layer and the occurrence of wiring disconnection or the like even under application of heat in manufacturing of a semiconductor apparatus.

The polyimide has a relatively low glass transition temperature (Tg), but is high in heat resistance as described above. Accordingly, the polyimide layer can also be used as an insulation layer or the like of a semiconductor apparatus because the polyimide layer is hardly decomposed even in the case where a solder ball or the like is adjacently formed so as to be in contact with the polyimide layer.

The method for manufacturing a semiconductor apparatus of the present invention includes at least forming a polyimide layer on a support material, forming a rewiring layer on the support material with the polyimide layer being interposed, disposing a semiconductor chip on the rewiring layer and joining the rewiring layer and the semiconductor chip so as to electrically conduct the rewiring layer and the semiconductor chip, sealing the semiconductor chip joined to the rewiring layer, with a sealing material, and releasing the support material from the polyimide layer.

The method for manufacturing a semiconductor apparatus of the present invention may include any operation other than the above, and may further include, for example, forming a release layer on the polyimide layer after the polyimide layer formation and before the rewiring layer formation. The method may include releasing the release layer after the support material releasing, forming an external connection electrode electrically connected to the rewiring layer, and separating a semiconductor apparatus.

Hereinafter, each operation of the method for manufacturing a semiconductor apparatus of the present invention will be described.

3-1. Polyimide Layer Formation

The polyimide layer formation of the method for manufacturing a semiconductor apparatus of the present invention is for forming a polyimide layer on a support material. The support material that allows the polyimide layer to be formed is not particularly limited as long as the support material is a member that has a smooth surface and that can support a rewiring layer or the like with being not warped in manufacturing of a semiconductor apparatus. The type of the support material is appropriately selected depending on the method of forming the polyimide layer in the present formation, and the method of releasing the support material in support material releasing described below. For example, in the case where the polyimide layer is formed by coating of a vanish including polyimide and a solvent in the present formation and/or in the case where the polyimide layer is partially dissolved with a solvent in support material releasing described below, a support material having sufficient resistance to such a solvent is selected. In the case where irradiation with laser light is made with the support material being interposed, to thereby release the support material, in support material releasing described below, a support material high in permeability to laser light is selected. Such a support material can be the same as the support material for use in the method for manufacturing a semiconductor substrate, and the shape and the thickness thereof are appropriately selected depending on the desired size, type, and the like of a semiconductor apparatus.

On the other hand, the method for forming the polyimide layer is not particularly limited as long as the method is a method that can form a smooth layer without the occurrence of any air bubbles in the resulting polyimide layer, and the method can be the same as the method for forming the polyimide layer in the above method for manufacturing a semiconductor substrate. Specifically, a method can be adopted which includes preparing a varnish including polyimide dissolved in a solvent, coating the support material with the varnish, and drying the resultant. On the other hand, a method may also be adopted which includes producing a polyimide film including polyimide in advance, and bonding the polyimide film to the support material.

The thickness of the polyimide layer to be formed in the present formation can be freely set depending on any wafer to be secured, and generally, the thickness is preferably 1 to 500 μm, more preferably 1 to 100 μm. A too large thickness of the polyimide layer may cause the solvent for use in the formation of the polyimide layer to be hardly extracted from the polyimide layer, thereby causing voids to occur. On the other hand, a too small thickness of the polyimide layer may cause adhesiveness to the support material or the rewiring layer not to be sufficiently achieved.

The glass transition temperature of the polyimide layer to be formed in the present formation is 210° C. or less, more preferably 100 to 210° C. The glass transition temperature of the polyimide layer preferably falls within the range in terms of productivity because the heating temperature in formation of a separate film and then bonding thereof to a support substrate is low. The glass transition temperature (Tg) of the polyimide layer can be adjusted depending on the structure of the polyimide (tetracarboxylic dianhydride ($\alpha$) and diamine ($\beta$)). The glass transition temperature of the polyimide layer can be measured by the same method as the above method.

The storage elastic modulus E' of the polyimide layer to be formed in the present formation, at (glass transition temperature+30° C.), is preferably $1.0 \times 10^5$ Pa or more, more preferably $1.0 \times 10^6$ Pa or more. The storage elastic modulus E' of the polyimide layer to be formed in the present operation, at 180° C., is preferably $1.0 \times 10^5$ Pa or more, more preferably $1.0 \times 10^6$ Pa or more. The storage elastic modulus E' can also be determined by the above method.

3-2. Release Layer Formation

After the polyimide layer formation, release layer formation may also be performed. In the case where a release layer is formed, the polyimide layer can be easily removed from the rewiring layer by release layer releasing described below.

The release layer can be the same as a known release layer, and examples thereof include, but are not limited thereto, a layer made of a resin such as polyolefin, and an inorganic layer of Ni.

The method for forming the release layer is not particularly limited, and can be, for example, a method including coating the polyimide layer with a varnish including the resin and a solvent according to screen printing, dispenser coating or the like, and drying the resultant, or a method including providing an inorganic layer according to vapor deposition, sputtering or the like.

The thickness of the release layer, which is a resin layer, is preferably 1 to 50 μm. In the case where the thickness of the release layer falls within the range, the rewiring layer is easily released in release layer releasing described below. A rewiring layer can also be bonded without loss of unevenness thereof, if necessary, demanded.

3-3. Rewiring Layer Formation

Subsequently, a rewiring layer is formed on the polyimide layer (on the release layer in the case where the release layer formation is performed). The rewiring layer can be a layer including a conducting passage, and an insulating resin and the like disposed around the passage. According to the method of the present invention, many semiconductor apparatuses can be formed on the support material at one time. Only one of the rewiring layer, or two or more of the rewiring layers may be formed in the present formation. Such rewiring layers which have a different wiring pattern from each other may also be formed.

The rewiring layer can be formed by a known method. For example, the rewiring layer can be formed by patterning a thin film of metal according to various methods, or by forming a layer including an insulating resin by use of a photosensitive resin. A conducting passage for connection to a semiconductor chip is here formed so that the conducting passage is exposed on the surface of the rewiring layer.

3-4. Semiconductor Chip Joining

Thereafter, a semiconductor chip is disposed on the rewiring layer, and the rewiring layer and the semiconductor chip are electrically connected. Specifically, a semiconductor chip is disposed so that an electrode of the semiconductor chip is located on the conducting passage of the rewiring layer, and the semiconductor chip and the rewiring layer are joined by flip-chip bonding or the like so as to be electrically conducted. In the case where a plurality of such rewiring layers is formed on the support material, the semiconductor chip is joined to each of the rewiring layers. The type, the size, and the like of the semiconductor chip to be joined to the rewiring layer are not particularly limited, and are appropriately selected depending on a desired semiconductor apparatus.

3-5. Sealing

After the semiconductor chip is mounted, a portion of the semiconductor chip, other than a connection section thereof to the rewiring layer, is sealed with a sealing material. The method for sealing the semiconductor chip can be a known method. For example, the semiconductor chip is coated with a resin composition including a curable resin such as an epoxy resin and a filling material by a dispenser, or printing is made according to various printing methods. Thereafter, the resin composition can be cured to thereby form a sealing material.

3-6. Support Material Releasing

Subsequently, the support material is released from the polyimide layer. The method for releasing the support material from the polyimide layer is preferably a method in which stress is hardly applied to the rewiring layer, the semiconductor chip, and the like, from the viewpoint of prevention of cracks and wiring disconnection in the rewiring layer.

The method for releasing the support material can be the same as the releasing method in the support material releasing in the method for manufacturing a semiconductor substrate. For example, the method can be a method including irradiating the polyimide layer with laser light through the support material, thereby sublimating, dissolving, or decomposing at least a part of the polyimide layer facing the support material, to release the support material, or a method including feeding a solvent to an interface between the support material and the polyimide layer, thereby dissolving the polyimide layer facing the support material, to release the support material.

While the polyimide layer may be fully removed in the present releasing, only a part of the polyimide layer is preferably removed in the case where the polyimide layer is used as an insulation layer.

3-7. Release Layer Releasing

In the case of formation of the release layer in the release layer formation, releasing of the release layer and the polyimide layer may also be performed after releasing of the support material.

The method for releasing the polyimide layer and the release layer is not particularly limited and can be, for example, a method including gripping partially or fully the polyimide layer and the release layer and pulling them in a certain direction for releasing with, if necessary, warming to 15 to 100° C., preferably 20 to 80° C. The gripping method is not particularly limited, and a known method, namely, a releasing tape and/or a suction nozzle may be used.

3-8. External Connection Electrode Formation

Formation of an external connection electrode on the rewiring layer may also be, if necessary, performed. In the case where the polyimide layer remains on the rewiring layer, the polyimide layer can be partially subjected to patterning by laser processing or lithographic processing, thereby allowing the rewiring layer and the external connection electrode to be electrically connected. Such remaining of the polyimide layer around the external connection electrode has the advantage of suppressing breaking and the like of the external connection electrode (solder ball).

3-9. Separation

As described above, the method for manufacturing a semiconductor apparatus of the present invention enables a plurality of semiconductor apparatuses to be formed on the support material at one time. After the support material releasing, separation of such semiconductor apparatuses may also be performed at any timing. The separation method is not particularly limited, and can be a known method.

Figure 3:
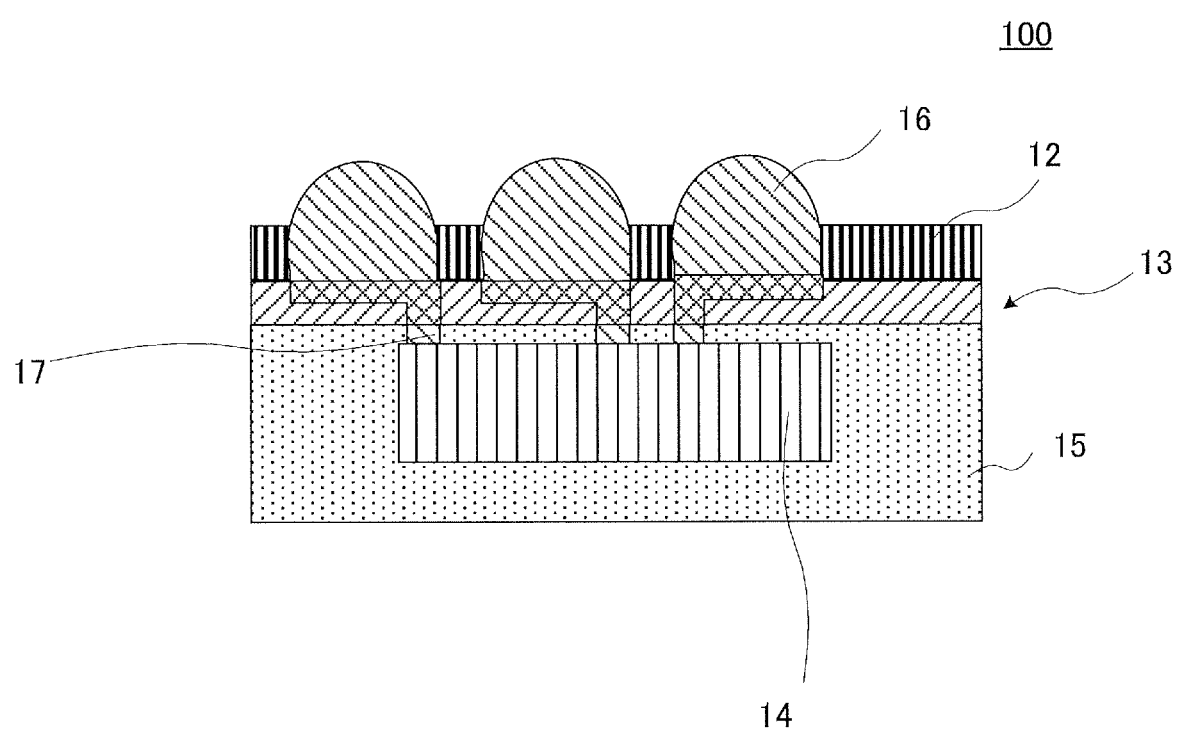
FIG. 3 illustrates a schematic view for illustrating the configuration of the semiconductor apparatus of the present invention.

The above operations provide, for example, semiconductor apparatus 100 including semiconductor chip 14, electrode 17 formed on semiconductor chip 14, sealing material 15 that seals the periphery of semiconductor chip 14 so that electrode 17 is partially exposed, rewiring layer 13 formed on sealing material 15 and electrically connected to electrode 17, external connection electrode 16 formed on rewiring layer 13 and electrically connected to the rewiring layer, and polyimide layer 12 disposed on rewiring layer 13 and around external connection electrode 16, as illustrated in FIG. 3. Semiconductor apparatus 100 to be produced by the manufacturing method of the present invention hardly causes any load to be applied onto rewiring layer 13 and semiconductor chip 14 in the production. Accordingly, few cracks and the like occur and less wiring disconnection and the like also occur on rewiring layer 13. Accordingly, semiconductor apparatus 100 having very high reliability can be obtained.

EXAMPLES

Hereinafter, the present invention will be specifically described with reference to Examples and Comparative Examples, but the present invention is not intended to be limited to such Examples.

(Polyimide Varnish)

Polyimide varnish MP14C (varnish where 0.1 mass % or more of polyimide having a glass transition temperature of 138° C. was dissolved in NMP, viscosity: 2,000 mPa·s) manufactured by Mitsui Chemicals, Inc. was used.

(Method 1 of Bonding Polyimide Film on Upper Surface of Base Material)

A glass base material was coated with the polyimide varnish by a spin coater (1,000 mPa·s, −10 sec.). A polyimide coating liquid formed on a glass substrate was subjected to drying in a dryer filled with a nitrogen atmosphere and set to 150° C., for 10 minutes. A polyimide film having a thickness of 20 μm, bonded onto the glass substrate, was obtained.

(Method 2 of Bonding Polyimide Film on Upper Surface of Base Material)

A polyimide film having a thickness of 20 μm, formed in advance on a laminate sheet (PET base material) by use of the polyimide varnish, was pressure-bonded to a glass base material heated to 200° C., thereby fixing the polyimide film, and thereafter the laminate sheet was released to form a polyimide film bonded onto the upper surface of the glass substrate.

Example 1

Each polyimide film was formed on the surface of a glass substrate, according to the bonding methods 1 and 2, providing each laminate of the glass substrate and the polyimide film. The laminate was selectively irradiated with solid UV laser beam of 355 nm (output: 85 W, release energy density: 210 mJ/cm$^2$, beam size: 100×0.035 mm, pulse width: 60 ns) through the rear surface of the glass substrate (opposite to a surface on which the film was stacked).

It was confirmed with respect to the respective laminates obtained in bonding methods 1 and 2 that the polyimide layer was released from the glass interface due to the laser abrasion effect.

The present application claims the priority based on Japanese Patent Application No. 2017-084694 filed on Apr. 21, 2017. All the disclosures described in the specification and the accompanying drawings of this application are incorporated in the specification and the accompanying drawings of the present application.

INDUSTRIAL APPLICABILITY

As described above, the method for manufacturing a semiconductor substrate of the present invention enables a non-circuit-formed face of a semiconductor wafer to be ground without dropping of such a semiconductor wafer in the grinding. Furthermore, the method for manufacturing a semiconductor substrate allows cracking and breaking to hardly occur on the resulting semiconductor substrate. Accordingly, the method is very useful for manufacturing of various semiconductor substrates. The method for manufacturing a semiconductor apparatus of the present invention enables a semiconductor apparatus to be manufactured without the occurrence of any wiring disconnection or the like in a rewiring layer, and is useful particularly for manufacturing of a fan out wafer level package.

REFERENCE SIGNS LIST

1, 11 support material
2, 12 polyimide layer
3 semiconductor wafer

3' semiconductor substrate
3a circuit-formed face
3b non-circuit-formed face
13 rewiring layer
14 semiconductor chip
15 sealing material
16 external connection electrode
17 electrode
100 semiconductor apparatus

The invention claimed is:

1. A method for manufacturing a semiconductor substrate, comprising:
    forming a polyimide layer on a support material;
    bonding the support material and a circuit-formed face of a semiconductor wafer with the polyimide layer being interposed therebetween;
    grinding a non-circuit-formed face of the semiconductor wafer to which the support material is bonded;
    releasing the support material from the polyimide layer; and
    releasing the polyimide layer from the semiconductor wafer, wherein
    a polyimide for use in the polyimide layer has a glass transition temperature of 210° C. or less and is dissolvable in a solvent; wherein
    the polyimide comprises a polycondensation unit of a tetracarboxylic dianhydride (α) and a diamine (β);
    the tetracarboxylic dianhydride (α) comprises an aromatic tetracarboxylic dianhydride (α1) having a benzophenone backbone, represented by the following formula (1), or the diamine (β) comprises an aromatic diamine (β1) having a benzophenone backbone, represented by the following formula (2),

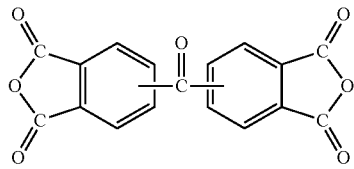

(1)

(2)

a total amount of the aromatic tetracarboxylic dianhydride (α1) and the aromatic diamine (β1) is 5 to 49 mol % based on a total amount of the tetracarboxylic dianhydride (α) and the diamine (β);
    the diamine (β) comprises an aliphatic diamine (β5) represented by the following formula (3) or (4),

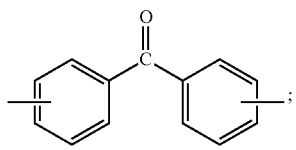

(3)

wherein in formula (3), $R_1$ is an aliphatic chain having a main chain containing any one or more atoms of C, N, and O, a total number of atoms constituting the main chain is 7 to 500, the aliphatic chain further has a side chain containing any one or more atoms of C, N, H, and O, and a total number of atoms constituting the side chain is 10 or less, $$H_2N-R_2-NH_2 \quad (4)$$

wherein in formula (4), $R_2$ is an aliphatic chain having a main chain containing any one or more atoms of C, N, and O, a total number of atoms constituting the main chain is 5 to 500, the aliphatic chain further has a side chain containing any one or more atoms of C, N, H, and O, and a total number of atoms constituting the side chain is 10 or less; and
    the polyimide has an amine equivalent of 4,000 to 20,000.

2. The method for manufacturing a semiconductor substrate according to claim 1, wherein
    the total amount of the aromatic tetracarboxylic dianhydride (α1) and the aromatic diamine (β1) is 5 to 30 mol % based on the total amount of the tetracarboxylic dianhydride (α) and the diamine (β),
    a total amount of a tetracarboxylic dianhydride and a diamine each not having any aliphatic chain having 3 or more carbon atoms in a main chain is 95 mol % or more based on the total amount of the tetracarboxylic dianhydride (α) and the diamine (β),
    the tetracarboxylic dianhydride (α) comprises an aromatic tetracarboxylic dianhydride (α2) not having a biphenyl backbone but having a diphenyl ether backbone, or the diamine (β) comprises an aromatic diamine (β2) not having a biphenyl backbone but having a diphenyl ether backbone,
    a total amount of the aromatic tetracarboxylic dianhydride (α2) and the aromatic diamine (β2) is 40 mol % or more and 95 mol % or less based on the total amount of the tetracarboxylic dianhydride (α) and the diamine (β), and a total amount of an aromatic tetracarboxylic dianhydride (α3) not having a biphenyl backbone but having a diphenyl ether backbone and having three or more aromatic rings, and an aromatic diamine (β3) not having a biphenyl backbone but having a diphenyl ether backbone and having three or more aromatic rings is 20 mol % or more based on the total amount of the tetracarboxylic dianhydride (α) and the diamine (β),
    the tetracarboxylic dianhydride (α) comprises an aromatic tetracarboxylic dianhydride (α4) having a biphenyl backbone, or the diamine (β) comprises an aromatic diamine (β4) having a biphenyl backbone,
    a total amount of the aromatic tetracarboxylic dianhydride (α4) and the aromatic diamine (β4) is 0 mol % or more and less than 45 mol % based on the total amount of the tetracarboxylic dianhydride (α) and the diamine (β), and
    the polyimide has a viscosity average molecular weight η of 0.6 or more and 1.60 or less.

3. The method for manufacturing a semiconductor substrate according to claim 1, further comprising
    processing a non-circuit-formed face of the semiconductor wafer at a temperature of 180° C. or more, after the wafer grinding and before the support material releasing.

4. The method for manufacturing a semiconductor substrate according to claim 1, further comprising
    forming an unevenness absorbing layer on the polyimide layer after the polyimide layer formation and before the wafer bonding, wherein
    the wafer bonding comprises bonding the support material and the circuit-formed face of the semiconductor wafer with the polyimide layer and the unevenness absorbing layer being interposed therebetween, and the polyimide layer releasing comprises releasing the unevenness absorbing layer and the polyimide layer from the semiconductor wafer.

5. The method for manufacturing a semiconductor substrate according to claim 1, wherein
the support material releasing comprises irradiating an interface between the support material and the polyimide layer with laser light.

6. The method for manufacturing a semiconductor substrate according to claim 1, wherein
the support material releasing comprises dissolving at least a part of the polyimide layer with a solvent.

7. The method for manufacturing a semiconductor substrate according to claim 1, wherein
the polyimide layer formation comprises coating with a varnish comprising a solvent and the polyimide, and drying the varnish.

8. The method for manufacturing a semiconductor substrate according to claim 1, wherein
the polyimide layer formation comprises bonding a polyimide sheet comprising the polyimide, to the support material.

9. A method for manufacturing a semiconductor apparatus, comprising:
forming a polyimide layer on a support material;
forming a rewiring layer on the support material with the polyimide layer being interposed therebetween;
disposing a semiconductor chip on the rewiring layer, and joining the rewiring layer and the semiconductor chip so as to electrically conduct the rewiring layer and the semiconductor chip;
sealing the semiconductor chip joined to the rewiring layer, with a sealing material; and
releasing the support material from the polyimide layer, wherein
a polyimide for use in the polyimide layer has a glass transition temperature of 210° C. or less and is dissolvable in a solvent; wherein
the polyimide comprises a polycondensation unit of a tetracarboxylic dianhydride ($\alpha$) and a diamine ($\beta$);
the tetracarboxylic dianhydride ($\alpha$) comprises an aromatic tetracarboxylic dianhydride ($\alpha$1) having a benzophenone backbone, represented by the following formula (1), or the diamine ($\beta$) comprises an aromatic diamine ($\beta$1) having a benzophenone backbone, represented by the following formula (2),

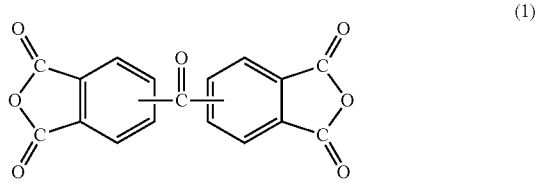

(1)

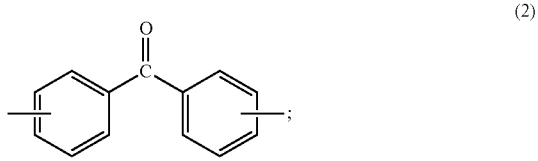

(2)

a total amount of the aromatic tetracarboxylic dianhydride ($\alpha$1) and the aromatic diamine ($\beta$1) is 5 to 49 mol % based on a total amount of the tetracarboxylic dianhydride ($\alpha$) and the diamine ($\beta$);

the diamine ($\beta$) comprises an aliphatic diamine ($\beta$5) represented by the following formula (3) or (4),

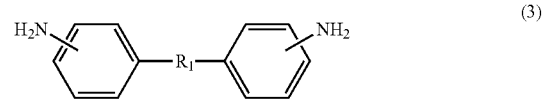

(3)

wherein in formula (3), $R_1$ is an aliphatic chain having a main chain containing any one or more atoms of C, N, and O, a total number of atoms constituting the main chain is 7 to 500, the aliphatic chain further has a side chain containing any one or more atoms of C, N, H, and O, and a total number of atoms constituting the side chain is 10 or less,

$H_2N-R_2-NH_2$ (4)

wherein in formula (4), $R_2$ is an aliphatic chain having a main chain containing any one or more atoms of C, N, and O, a total number of atoms constituting the main chain is 5 to 500, the aliphatic chain further has a side chain containing any one or more atoms of C, N, H, and O, and a total number of atoms constituting the side chain is 10 or less; and
the polyimide has an amine equivalent of 4,000 to 20,000.

10. The method for manufacturing a semiconductor apparatus according to claim 9, wherein
the total amount of the aromatic tetracarboxylic dianhydride ($\alpha$1) and the aromatic diamine ($\beta$1) is 5 to 30 mol % based on the total amount of the tetracarboxylic dianhydride ($\alpha$) and the diamine ($\beta$),
a total amount of a tetracarboxylic dianhydride and a diamine each not having any aliphatic chain having 3 or more carbon atoms in a main chain is 95 mol % or more based on the total amount of the tetracarboxylic dianhydride ($\alpha$) and the diamine ($\beta$),
the tetracarboxylic dianhydride ($\alpha$) comprises an aromatic tetracarboxylic dianhydride ($\alpha$2) not having a biphenyl backbone but having a diphenyl ether backbone, or the diamine ($\beta$) comprises an aromatic diamine ($\beta$2) not having a biphenyl backbone but having a diphenyl ether backbone,
a total amount of the aromatic tetracarboxylic dianhydride ($\alpha$2) and the aromatic diamine ($\beta$2) is 40 mol % or more and 95 mol % or less based on the total amount of the tetracarboxylic dianhydride ($\alpha$) and the diamine ($\beta$), and a total amount of an aromatic tetracarboxylic dianhydride ($\alpha$3) not having a biphenyl backbone but having a diphenyl ether backbone and having three or more aromatic rings, and an aromatic diamine ($\beta$3) not having a biphenyl backbone but having a diphenyl ether backbone and having three or more aromatic rings is 20 mol % or more based on the total amount of the tetracarboxylic dianhydride ($\alpha$) and the diamine ($\beta$),
the tetracarboxylic dianhydride ($\alpha$) comprises an aromatic tetracarboxylic dianhydride ($\alpha$4) having a biphenyl backbone, or the diamine ($\beta$) comprises an aromatic diamine ($\beta$4) having a biphenyl backbone,
a total amount of the aromatic tetracarboxylic dianhydride ($\alpha$4) and the aromatic diamine ($\beta$4) is 0 mol % or more and less than 45 mol % based on the total amount of the tetracarboxylic dianhydride ($\alpha$) and the diamine ($\beta$), and
the polyimide has a viscosity average molecular weight $\eta$ of 0.6 or more and 1.60 or less.

11. The method for manufacturing a semiconductor apparatus according to claim 9, wherein the method further comprises forming a release layer on the polyimide layer after the polyimide layer formation and before the rewiring layer formation, the rewiring layer formation comprises forming the rewiring layer on the support material with the polyimide layer and the release layer being interposed, and the method further comprises releasing the release layer from the rewiring layer after the support material releasing.

12. The method for manufacturing a semiconductor apparatus according to claim 9, further comprising forming, on the rewiring layer, an external connection electrode to be electrically connected to the rewiring layer, after the support material releasing.

13. The method for manufacturing a semiconductor apparatus according to claim 9, wherein the support material releasing comprises irradiating an interface between the support material and the polyimide layer with laser light.

14. The method for manufacturing a semiconductor apparatus according to claim 9, wherein the support material releasing comprises dissolving at least a part of the polyimide layer with a solvent.

15. The method for manufacturing a semiconductor apparatus according to claim 9, wherein the polyimide layer formation comprises coating with a varnish comprising a solvent and the polyimide, and drying the varnish.

16. The method for manufacturing a semiconductor apparatus according to claim 9, wherein the polyimide layer formation comprises bonding a polyimide sheet comprising the polyimide, to the support material.

17. A semiconductor apparatus, comprising:

a semiconductor chip;

an electrode formed on the semiconductor chip;

a sealing material that seals a periphery of the semiconductor chip such that a portion of the electrode is exposed;

a rewiring layer formed on the sealing material and electrically connected to the electrode;

an external connection electrode formed on the rewiring layer and electrically connected to the rewiring layer; and a polyimide layer disposed on the rewiring layer and around the external connection electrode, wherein the polyimide layer comprises a polycondensation unit of a tetracarboxylic dianhydride (α) and a diamine (β), the tetracarboxylic dianhydride (α) comprises an aromatic tetracarboxylic dianhydride (α1) having a benzophenone backbone, represented by the following formula (1), or the diamine (β) comprises an aromatic diamine (β1) having a benzophenone backbone, represented by the following formula (2),

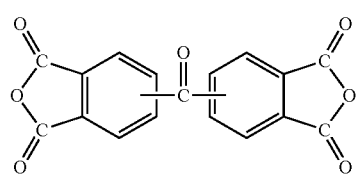

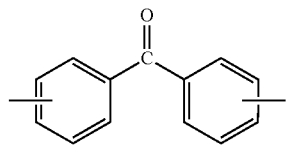

a total amount of the aromatic tetracarboxylic dianhydride (α1) and the aromatic diamine (β1) is 5 to 49 mol % based on a total amount of the tetracarboxylic dianhydride (α) and the diamine (β), the diamine (β) comprises an aliphatic diamine (β5) represented by the following formula (3) or (4),

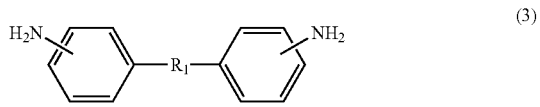

wherein in formula (3), $R_1$ is an aliphatic chain having a main chain containing any one or more atoms of C, N, and O, a total number of atoms constituting the main chain is 7 to 500, the aliphatic chain further has a side chain containing any one or more atoms of C, N, H, and O, and a total number of atoms constituting the side chain is 10 or less,

wherein in formula (4), $R_2$ is an aliphatic chain having a main chain containing any one or more atoms of C, N, and O, a total number of atoms constituting the main chain is 5 to 500, the aliphatic chain further has a side chain containing any one or more atoms of C, N, H, and O, and a total number of atoms constituting the side chain is 10 or less, and the semiconductor apparatus comprises a polyimide having an amine equivalent of 4,000 to 20,000.

18. The semiconductor apparatus according to claim 17, wherein the polyimide is such that the total amount of the aromatic tetracarboxylic dianhydride (α1) and the aromatic diamine (β1) is 5 to 30 mol % based on the total amount of the tetracarboxylic dianhydride (a) and the diamine (β), a total amount of a tetracarboxylic dianhydride and a diamine each not having any aliphatic chain having 3 or more carbon atoms in a main chain is 95 mol % or more based on the total amount of the tetracarboxylic dianhydride (α) and the diamine (β), the tetracarboxylic dianhydride (α) comprises an aromatic tetracarboxylic dianhydride (α2) not having a biphenyl backbone but having a diphenyl ether backbone, or the diamine (β) comprises an aromatic diamine (β2) not having a biphenyl backbone but having a diphenyl ether backbone, a total amount of the aromatic tetracarboxylic dianhydride (α2) and the aromatic diamine (β2) is 40 mol % or more and 95 mol % or less based on the total amount of the tetracarboxylic dianhydride (α) and the diamine (β), and a total amount of an aromatic tetracarboxylic dianhydride (α3) not having a biphenyl backbone but having a diphenyl ether backbone and having three or more aromatic rings, and an aromatic diamine (β3) not having a biphenyl backbone but having a diphenyl ether backbone and having three or more aromatic rings is 20 mol % or more based on the total amount of the tetracarboxylic dianhydride (α) and the diamine (β), the tetracarboxylic dianhydride (α) comprises an aromatic tetracarboxylic dianhydride (α4) having a biphenyl backbone, or the diamine (β) comprises an aromatic diamine (β4) having a biphenyl backbone, a total amount of the aromatic tetracarboxylic dianhydride (α4) and the aromatic diamine (β4) is 0 mol % or more and less than 45 mol % based on the total amount of the tetracarboxylic dianhydride (α) and the diamine (β), and the polyimide has a viscosity average molecular weight η of 0.6 or more and 1.60 or less.

\* \* \* \* \*